(12) United States Patent
Berner et al.

(10) Patent No.: US 12,010,447 B2
(45) Date of Patent: *Jun. 11, 2024

(54) DYNAMIC VISION SENSOR ARCHITECTURE

(71) Applicant: SONY ADVANCED VISUAL SENSING AG, Schlieren (CH)

(72) Inventors: Raphael Berner, Confignon (CH); Christian Brändli, Baden (CH)

(73) Assignee: SONY ADVANCED VISUAL SENSING AG, Schilleren (CH)

( * ) Notice: Subject to any disclaimer, the term of this patent is extended or adjusted under 35 U.S.C. 154(b) by 0 days.

This patent is subject to a terminal disclaimer.

(21) Appl. No.: 18/206,634

(22) Filed: Jun. 7, 2023

(65) Prior Publication Data

US 2023/0328406 A1    Oct. 12, 2023

Related U.S. Application Data

(63) Continuation of application No. 17/366,392, filed on Jul. 2, 2021, now Pat. No. 11,711,631, which is a
(Continued)

(30) Foreign Application Priority Data

Dec. 30, 2016  (CH) .............................. 20160001764
Dec. 30, 2016  (CH) .............................. 20160001765

(51) Int. Cl.
*H04N 25/77*    (2023.01)
*G01J 1/46*     (2006.01)
(Continued)

(52) U.S. Cl.
CPC ................ *H04N 25/75* (2023.01); *G01J 1/46* (2013.01); *G06F 11/004* (2013.01); *G06T 7/20* (2013.01);
(Continued)

(58) Field of Classification Search
None
See application file for complete search history.

(56) References Cited

U.S. PATENT DOCUMENTS 5,107,103 A    4/1992   Gruss et al.
5,488,415 A    1/1996   Uno
(Continued)

FOREIGN PATENT DOCUMENTS

CN    103259985 A    4/2008
CN    103259985 A    8/2013
(Continued)

OTHER PUBLICATIONS

Brandli, C., et al., "A 240×180 130 dB 3 US Latency Global Shutter Spatiotemporal Vision Sensor," IEEE J. Solid-State Circuits, 49(10): 2333-2341 (2014).
(Continued)

*Primary Examiner* — Paul M Berardesca
(74) *Attorney, Agent, or Firm* — HoustonHogle LLP

(57) ABSTRACT

A dynamic vision sensor (DVS) or change detection sensor reacts to changes in light intensity and in this way monitors how a scene changes. This disclosure covers both single pixel and array architectures. The DVS may contain one pixel or 2-dimensional or 1-dimensional array of pixels. The change of intensities registered by pixels are compared, and pixel addresses where the change is positive or negative are recorded and processed. Analyzing frames based on just three values for pixels, increase, decrease or unchanged, the proposed DVS can process visual information much faster than traditional computer vision systems, which correlate multi-bit color or gray level pixel values between successive frames.

20 Claims, 37 Drawing Sheets

Related U.S. Application Data continuation of application No. 16/737,987, filed on Jan. 9, 2020, now Pat. No. 11,076,114, which is a continuation of application No. 15/858,427, filed on Dec. 29, 2017, now Pat. No. 10,567,679.

(51) Int. Cl.

| | | |
|---|---|---|
| G06F 11/00 | (2006.01) | |
| G06T 7/20 | (2017.01) | |
| H04N 25/40 | (2023.01) | |
| H04N 25/47 | (2023.01) | |
| H04N 25/571 | (2023.01) | |
| H04N 25/75 | (2023.01) | |
| H04N 25/766 | (2023.01) | |
| H04N 25/772 | (2023.01) | |

(52) U.S. Cl.
CPC ............ *H04N 25/40* (2023.01); *H04N 25/47* (2023.01); *H04N 25/573* (2023.01); *H04N 25/766* (2023.01); *H04N 25/77* (2023.01); *H04N 25/772* (2023.01); *G06F 2201/86* (2013.01); *G06F 2201/88* (2013.01)

(56) References Cited

U.S. PATENT DOCUMENTS

| | | | |
|---|---|---|---|
| 6,253,161 | B1 | 6/2001 | Arias-Estrada |
| 6,624,849 | B1 | 9/2003 | Nomura |
| 7,728,269 | B2 | 6/2010 | Lichtsteiner et al. |
| 7,821,558 | B2 | 10/2010 | Segura Puchades |
| 9,143,680 | B2 | 9/2015 | Lee et al. |
| 9,521,337 | B1 | 12/2016 | Shen et al. |
| 9,544,507 | B2 | 1/2017 | Serrano Gotarredona et al. |
| 9,631,974 | B2 | 4/2017 | Delbruck et al. |
| 9,693,001 | B2 | 6/2017 | Kim et al. |
| 9,739,660 | B2 | 8/2017 | Suh et al. |
| 2004/0036785 | A1 | 2/2004 | Takayanagi |
| 2007/0109434 | A1 | 5/2007 | Puchades |
| 2007/0222879 | A1 | 9/2007 | Glenn et al. |
| 2008/0106622 | A1 | 5/2008 | Turchetta et al. |
| 2008/0135731 | A1 | 6/2008 | Lichtsteiner et al. |
| 2013/0215286 | A1 | 8/2013 | Ohya et al. |
| 2013/0277539 | A1 | 10/2013 | Smilansky et al. |
| 2013/0278804 | A1 | 10/2013 | Denham et al. |
| 2014/0061442 | A1 | 3/2014 | Denham |
| 2014/0204250 | A1 | 7/2014 | Kim et al. |
| 2014/0239430 | A1 | 8/2014 | Egawa |
| 2014/0313387 | A1 | 10/2014 | Vogelsang et al. |
| 2014/0326854 | A1 | 11/2014 | Delbruck et al. |
| 2015/0069218 | A1 | 3/2015 | Cho et al. |
| 2015/0116564 | A1 | 4/2015 | Williams |
| 2015/0194454 | A1 | 7/2015 | Kim et al. |
| 2015/0281620 | A1 | 10/2015 | Usuda et al. |
| 2016/0078001 | A1 | 3/2016 | Wang et al. |
| 2016/0088251 | A1 | 3/2016 | Luo et al. |
| 2016/0093273 | A1 | 3/2016 | Wang et al. |
| 2016/0227135 | A1 | 8/2016 | Matolin et al. |
| 2016/0353041 | A1 | 12/2016 | Kim et al. |
| 2017/0140509 | A1 | 5/2017 | Lee et al. |

FOREIGN PATENT DOCUMENTS

| | | |
|---|---|---|
| CN | 104010141 A | 8/2014 |
| DE | 101 25 307 | 8/2002 |
| DE | 103 01 598 | 3/2004 |
| DE | 102014100394 | 7/2014 |
| EP | 0 553 406 | 4/1997 |
| EP | 1 657 910 | 5/2006 |
| EP | 2 538 665 | 12/2012 |
| JP | 2016-533140 A | 10/2016 |
| KR | 20060033796 A | 4/2006 |
| KR | 1020160071386 A | 6/2016 |
| WO | WO 2005008906 A2 | 1/2005 |
| WO | WO 2005008906 A3 | 5/2005 |
| WO | WO 2007085942 | 8/2007 |
| WO | WO 2010032842 A | 3/2010 |
| WO | WO 2013092666 | 6/2013 |
| WO | WO 2015036592 | 3/2015 |
| WO | WO 2015166176 | 11/2015 |
| WO | WO 2017149433 | 9/2017 |
| WO | WO 2017158483 | 9/2017 |
| WO | WO 2017174579 | 10/2017 |

OTHER PUBLICATIONS

Chi, Y.M., et al., "CMOS Camera with In-Pixel Temporal Change Detection and ADC," IEEE J. Solid-State Circuits, 42(10): 2187-2196 (2007).

Habibi, M., "A Low Power Smart CMOS Image Sensor for Surveillance Applications," Machine Vision and Image Processing (MVIP), 1-4 (2010).

International Search Report and Written Opinion of the International Searching Authority, mailed on Mar. 19, 2018, from International Application No. PCT/IB2017/058526, filed on Dec. 29, 2017. 17 pages.

Lichtsteiner, P., et al., "A 128×128 120 dB 15 µs Latency Asynchronous Temporal Contrast Vision Sensor," IEEE J. Solid-State Circuits, 43(2): 566-576 (2008).

Aizawa, K., et al., "On Sensor Image Compression," IEEE Trans. Circ. Sys. Video Tech., 7(3): 543-548 (1997).

Aizawa, K., et al., "Computational Image Sensor for On Sensor Compression," IEEE Trans. Elec. Dev., 44(10): 1724-1730 (1997).

Delbruck, T., et al., "32-Bit Configurable Bias Current Generator with Sub-Off-Current Capability," Circuits and Systems (ISCAS), 1647-1650 (2010).

Kramer, J., "An On/Off Transient Imager with Event-Driven, Asyncronous Read-Out," IEEE, 165-168 (2002).

International Search Report and Written Opinion of the International Searching Authority, mailed on Mar. 19, 2018, from International Application No. PCT/IB2017/058528, filed on Dec. 29, 2017. 11 pages.

Ruedi, P.-F., et al., "A 128×128 Pixel 120-dB Dynamtic-Range Vision-Sensor Chip for Image Contrast and Orientation Extraction," IEEE J. Solid-State Circ., 38 (12): 2325-2333 (2003).

International Search Report of the International Searching Authority, mailed on May 9, 2017, from International Application No. PCT/IB2017/051129, filed on Feb. 27, 2017. 5 pages.

Written Opinion of the International Searching Authority, mailed on May 9, 2017, from International Application No. PCT/IB2017/051129, filed on Feb. 27, 2017. 10 pages.

International Search Report of the International Searching Authority, mailed on May 29, 2017, from International Application No. PCT/IB2017/051421, filed on Mar. 10, 2017. 4 pages.

Written Opinion of the International Searching Authority, mailed on May 29, 2017, from International Application No. PCT/IB2017/051421, filed on Mar. 10, 2017. 9 pages.

Fu, Z., et al., "A 1.2mWCMOS Temporal-Difference Image Sensor for Sensor Networks," IEEE, 1064-1067 (2008).

International Preliminary Report on Patentability, mailed on Jul. 11, 2019, from International Application No. PCT/IB2017/058526, filed on Dec. 29, 2017. 13 pages.

Posch, C., et al., "An Asynchronous Time-Based Image Sensor," IEEE, 2130-2133 (2008).

J. Grant Houston, Registration No. 35,900, Jul. 3, 2023.

J. Grant Houston, Registration No. 35,900, Feb. 28, 2024.

FIG. 4A

| | Evt frame (100us) 212-1 | | | | Evt frame (100us) 212-2 | | | | Evt frame (100us) 212-3 | | | |
|---|---|---|---|---|---|---|---|---|---|---|---|---|
| Phase | 218-1 Comparison phase (10us) | 220-1 Comparison phase (10us) | 222-1 Event reset phase (20us) | 224-1 Event readout phase (60us) | 218-2 Comparison phase (10us) | 220-2 Comparison phase (10us) | 222-2 Event reset phase (20us) | 224-2 Event readout phase (60us) | 218-3 Comparison phase (10us) | 220-3 Comparison phase (10us) | 222-3 Event reset phase (20us) | 224-3 Event readout phase (60us) |
| Action | Comparison for ON events | Comparison for OFF events | pixel reset | Read out n1 events / Idle | Comparison for ON events | Comparison for OFF events | pixel reset | Read out n2 events / Idle | Comparison for ON events | Comparison for OFF events | pixel reset | Read out n3 events / Idle |

| | Evt frame (Variable) 212-1 | | | | Evt frame (Variable) 212-2 | | | | Evt frame (Variable) 212-3 | | | |
|---|---|---|---|---|---|---|---|---|---|---|---|---|
| Phase | 218-1 Comparison phase (10us) | 220-1 Comparison phase (10us) | 222-1 Event reset phase (20us) | 224-1 Event readout phase (Variable) | 218-2 Comparison phase (10us) | 220-2 Comparison phase (10us) | 222-2 Event reset phase (20us) | 224-2 Event readout phase (Variable) | 218-3 Comparison phase (10us) | 220-3 Comparison phase (10us) | 222-3 Event reset phase (20us) | 224-3 Event readout phase (Variable) |
| Action | Comparison for ON events | Comparison for OFF events | pixel reset | Read out n1 events | Comparison for ON events | Comparison for OFF events | pixel reset | Read out n2 events | Comparison for ON events | Comparison for OFF events | pixel reset | Read out n3 events |

214-1, 214-2, 214-3

DYNAMIC VISION SENSOR ARCHITECTURE

RELATED APPLICATIONS

This application is a Continuation of U.S. patent application Ser. No. 17/366,392, filed on Jul. 2, 2021, which is a Continuation of U.S. patent application Ser. No. 16/737,987, filed on Jan. 9, 2020, which is a Continuation of U.S. patent application Ser. No. 15/858,427, filed on Dec. 29, 2017, which claims priority to Swiss Provisional Patent Application No. CH20160001764, filed on 30 Dec. 2016, and Swiss Provisional Patent Application No. CH20160001765, filed on 30 Dec. 2016, all of which are incorporated herein by reference in their entirety.

FIELD OF THE INVENTION

This invention concerns vision sensors and more particularly dynamic or change detection sensors. These sensors react to changes in light intensity and in this way monitor how a scene changes.

BACKGROUND OF THE INVENTION

Today, machine vision is mostly based on conventional cameras and their associated frame-based image sensors. For some machine vision tasks, e.g., object recognition, these conventional frame-based cameras are well suited. However, for other tasks, e.g., tracking or position and motion estimation, the conventional image sensors have drawbacks.

The main drawback is that conventional cameras produce a significant amount of redundant and unnecessary data, which has to be captured, communicated and processed. This high data load slows down the reaction time by decreasing temporal resolution, results in increased power consumption, and increases the size and cost of machine vision systems. In addition, most image sensors suffer from limited dynamic range, poor low-light performance and motion blur.

These drawbacks arise from the fact that the data is captured as a sequence of still images (frames). In some cases, encoding dynamic scenes as still images is useful to produce beautiful images and movies but not optimal for data processing for machine vision uses.

Conventional computer vision systems using conventional cameras typically compare features between sequential image frames for object recognition. To estimate the position and orientation of a mobile system and to infer a three dimensional map of the surrounding world, two sequential images, which are partially overlapping but taken at different times and from different poses, are compared. To infer the motion that occurred between the two frames, characteristic visual landmarks (key points or other visual features) have to be matched across the two images. Finding these pairs of points that correspond to each other in both images is known as solving the "correspondence problem."

Solving the correspondence problem requires significant amount of processing power. To detect landmarks, every pixel in an image may have to be searched for characteristic features (corners, blobs, edges, etc.). The pixels and their surrounding neighborhood of pixels are then grouped to characterize the so called feature descriptors, which are then used for matching the features between the frames and thereby establishing pairs of corresponding points. This is computationally intensive. Direct approaches that directly compare pixel intensities are computationally even more complex.

On the other hand, the sip-called Dynamic Vision Sensor (DVS) is a sensor that overcomes the limitations of frame-based encoding. See U.S. Patent Application Publication No. US 2008/0135731, by Lichtsteiner et al., entitled "Photoarray for Detecting Time-Dependent Image Data", which is incorporated herein by this reference. By using in-pixel data compression, the data redundancy is removed and high temporal resolution, low latency, low power consumption, high dynamic range with little motion blur is achieved. DVS is thus well suited, especially for solar or battery powered compressive sensing or for mobile machine vision applications where the position of the system has to be estimated and where processing power is limited due to limited battery capacity.

The DVS pre-processes visual information locally. Instead of generating crisp images, the DVS produces smart data for computer applications. While conventional image sensors capture a movie as a series of still images, the DVS detects and only transmits the position of changes in a scene. It encodes the visual information much more efficiently than conventional cameras because it does in-pixel data compression. This means that processing of data is possible using less resources, lower net power and with faster system reaction time. The high temporal resolution allows continuously tracking visual features and thereby overcoming the correspondence problem. Additionally, the architecture of DVS allows for high dynamic range and good low-light performance.

SUMMARY OF THE INVENTION

A typical DVS can suffer from several drawbacks:
1. Pixel circuits can be large because they include an amplifier and two comparators, in some cases.
2. Asynchronous readout circuits are prone to timing jitter. If large areas of the scene change in a short time, jitter increases and data readout from parts of the sensor can be delayed, leading to motion artifacts.
3. Because DVS pixels circuits tend to be self-timed, a sensor time resolution cannot be imposed, and very fast changes in a small area can saturate the communication bandwidth.
4. DVS sensors have the property that the amount of output data produced depends mainly on the dynamics of the scene. The data rate is thus unpredictable, leading to problems in the processing stage, namely in overloading (i.e., the processing stage is not able to cope with the amount of data).
5. In some DVS sensors, pixels in the array are reset in each row after that row has been read out. This means slow movements are not detected, because small changes from frame to frame cannot be accumulated. Also existing pixel circuit designs are prone to motion artifacts due to the rolling shutter.

The present invention pertains to a DVS (Dynamic Vision Sensor) design. Different embodiments can be employed to mitigate, eliminate or make obsolete at least some of the disadvantages associated with existing solutions. For example, embodiments of the present invention allow for a reduction in the size of the pixel used in pixel arrays, and thus allow for a smaller sensor for the same resolution or a higher resolution for the same die size. Further, in some embodiments, the pixels of a pixel array may be operated synchronously (thus allowing for a sensor that works synchronously). Moreover, the time when changes in the light intensity are evaluated can be controlled, thus allowing for the time resolution and the event rate to be adaptable to the situation and application at hand.

The pixel circuit can work synchronously, aid/or with an external timing reference. This has several advantages enumerated below:

1. Event rate control by changing the time resolution of the sensor.
2. Frame-based readout allows the reading of the data from the pixel with less temporal jitter.
3. Having a clocked pixel circuit makes it easier to design the digital communication circuits that interface to the pixel array, allowing the use of standard digital design tools. Design of asynchronous circuits of a typical existing DVS tends to be more difficult because no appropriate commercial tools are available.
4. Controlling timing by means of a controller enables change detection and readout phases to be separated in time. This reduces the risk of generating false events due to parasitic coupling from one pixel to another.

In general according to one aspect, the invention features a sensor. The sensor typically comprises an array of pixels. The array can be a one or two dimensional array. Single pixel sensors are possible, however.

Each of the pixels of the sensor includes several elements. A photosensor detects incoming light. A photoreceptor signal is a function of the amount of light received by the photosensor. A memory capacitor is further provided, wherein first plate of the capacitor carries a charge from the photoreceptor signal, and a second plate of the capacitor is connected to a comparator node, voltage of which varies with changes in the photoreceptor signal. Then, one or more comparators compare voltages of the comparator node to one or more reference voltages to assess changes in the photoreceptor signals with respect to one or more thresholds.

In general, according to another aspect, the invention features a sensor. This sensor includes an array of pixels or a single pixel. Each of those pixels includes a photosensor. A photoreceptor signal is a function of the amount of light received by the photoreceptor. Further, a memory capacitor carries a charge from the photoreceptor signal. In the pixel only one comparator is provided. It compares voltages of the comparator node to one or more reference voltages to assess changes in the photoreceptor signals with respect to one or more thresholds.

The use of only a single comparator in the pixels has the advantage that it reduces the size of the pixel. This size reduction can be used to increase the size of the array for the same area of the semiconductor chip. On the other hand, it can be used to reduce the overall size of the sensor, enabling a lower cost device.

In general, according to another aspect, the invention features a sensor. This sensor also comprises an array of pixels or a single pixel. Each of the pixels includes a photosensor and a memory capacitor. The pixels further include a comparator that compares voltages from the memory capacitor to one or more reference voltages to assess changes in the photoreceptor signals with respect to one or more thresholds. According to the invention, the comparator also provides a reset voltage to the memory capacitor.

The use of the comparator to provide a reset voltage to the memory capacitor is useful because it resets the memory capacitor in a way that takes into account the offset in the comparator. This is important because each of the comparators in a pixel array might have a slightly different offset do to manufacturing variability. According to the invention, any resulting offset is removed by using the comparator to provide a reset voltage to the memory capacitor.

In general, according to another aspect, the invention features a sensor. The sensor also comprises an array of pixels or a single pixel. Each of the pixels includes a photosensor and a memory capacitor. A comparator is further provided in the pixel. It compares voltages from the memory capacitor to two reference voltages in succession to assess changes on the photoreceptor signals with respect an on-threshold or an off-threshold.

This invention has the advantage that it uses a single comparator to determine both on events and off events by successively comparing voltages from the memory capacitor to an on-threshold and an off-threshold.

In general, according to another aspect, the invention features a sensor. The sensor has an array of pixels or a single pixel. Each of those pixels includes a photosensor and a memory capacitor. Further, the pixels have one or more comparators that compare voltages from the memory capacitor to assess changes in the photoreceptor signal with respect to one or more thresholds. Finally, memory structures are provided in the pixels for storing the output of the one or more comparators.

Providing memory structures in the pixels allows the pixels to store the results of the thresholding. This allows for the timing of when that information is read out from the various pixels in an array, for example.

In general, according to another aspect, the invention features an array of pixels or a single pixel. Each of these pixels includes a photosensor and a memory capacitor. According to the invention, a switch is also provided in each of the pixels and is controlled by a shutter circuit signal that connects the photosensor to the memory capacitor. In this way, a global shutter signal can be provided to all of the pixels in an array.

The use of the global shutter has advantages in that a single signal can be used to trigger the entire array to avoid problems associated with a rolling shutter, for example.

In general, according to another aspect, the invention features a sensor. The sensor comprises an array of pixels or a single pixel. Each of those pixels includes a photosensor. A photoreceptor signal is based on the light received by the photosensor in a memory capacitor that carries a charge from the photoreceptor signal. According to the invention, one or more comparators are provided in a readout circuit for the array. These comparators compare voltages of the memory capacitors of the array to reference voltages to assess changes in the photoreceptor signals with respect to one or more thresholds.

In this invention, the comparators are removed to the peripheral circuits that surround the array of pixels. This allows the size of those corresponding pixels to be further reduced. On the other hand, a few comparators can be used to provide the necessary thresholding functions for the entire array.

In general, according to another aspect, the invention can also be characterized as a method. Specifically, a method of operation of a sensor comprises photosensors of pixels of an array detecting incoming light, generating photoreceptor signals that are a function of the amount of light received by the photosensors, using memory capacitors to store charges corresponding to previously detected light by the photosensors, wherein first plates of the capacitors carry charges from the photoreceptor signals, and second plates of the capacitors are connected to comparator nodes, the voltages of which vary with changes in the photoreceptor signals, and comparing voltages of the comparator nodes to one or more reference voltages to assess changes in the photoreceptor signals with respect to one or more thresholds.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 4A depicts phase timings for a change detection sensor with fixed frame rate where each phase of processing a frame takes a fixed amount of time.

FIG. 4B depicts phase timings for a change detection sensor with variable frame rate, where the variability is attributed to time taken by the event readout phase.

DETAILED DESCRIPTION OF THE PREFERRED EMBODIMENTS

Figure 1:
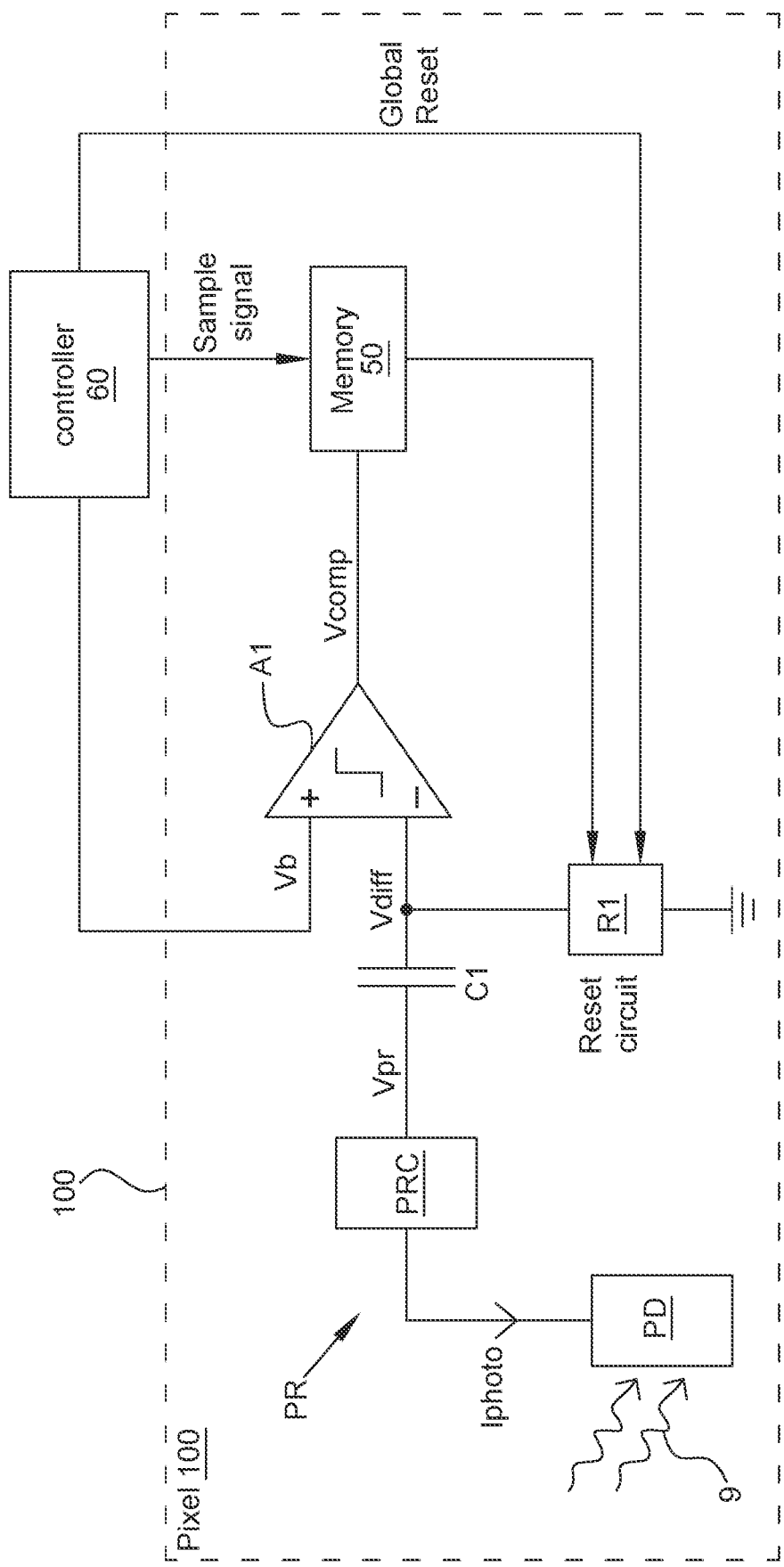
FIG. 1 is a circuit diagram showing the components and connections of a pixel circuit for a DVS or change detection sensor according to the principles of the present invention.

The invention now will be described more fully hereinafter with reference to the accompanying drawings, in which illustrative embodiments of the invention are shown. This invention may, however, be embodied in many different forms and should not be construed as limited to the embodiments set forth herein; rather; these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and the are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A number of technical terms are used throughout the application. They are defined below for convenience and precise description of the invention.

Closed switch: A switch that is conducting, i.e., the two terminals are electrically connected.

Electronic connection: Connection between two nodes in a circuit, either direct (electrical, so that current can flow between the two nodes), or via a buffer.

Event: Increase or decrease of light intensity at a given pixel.

Event-frame: One iteration of applying the threshold voltages, operating the memory, reading out and resetting the memory content.

Event rate: The number of events per second generated and transmitted by the pixel circuit. The event rate depends on the pixel circuit configuration, threshold setting and time resolution, and also on sensor motion and the observed scene.

Frame rate: Number of times each pixel is read per second. Equivalent to rate at which a complete event-frame is scanned. The frame rate can be fixed or made dependent on the number of events generated.

Motion artifact: A rolling shutter can exhibit a noticeable skew of would-be vertical lines in the image if either the camera or subject is moving quickly across the frame. The whole image can be warped if there is fast motion in the frame.

OFF-event: A discrete decrease in light intensity for a given pixel.

ON ON-event: A discrete increase in light intensity for a given pixel.

Open switch: A switch that is not conducting, i.e., an open circuit is provided between the two terminals.

Pixel address: A number or a pair of numbers describing the position of a pixel in the array. Usually a row number and a column number.

Power rail: Either ground (Vss) or the power supply (Vdd).

In general, FIG. 1 shows components of a pixel circuit, which are assembled and connected according to the principles of the present invention. Later in this document reference will be made to two-dimensional pixel arrays having rows and column of pixels, each of which has electronics as depicted in this embodiment or alternate embodiments.

A "pixel" in the present invention refers to a sensing element which records intensity of light impinging on it; "pixel circuit" or "pixel electronics" refers to the electronic components and circuitry of the pixel. In this document the term "pixel circuit" will be used to focus discussion on the electronics of the pixel, and the term "pixel" will be used to refer to the sensing element as a whole. Typically, a sensor (see FIG. 3) will be made up of a two-dimensional array of pixels 100 and additional peripheral circuitry. Nevertheless, a two dimensional array is not required for all applications. A sensor can also contain a single pixel (array of one pixel) or a one-dimensional array (line sensor) of pixels.

The major components of a pixel circuit 100 are enumerated below.

1. Photoreceptor module. As shown in the figure, the pixel circuit contains a photodiode PD, or other photosensor, to measure impinging light 9 and convert the light intensity to current Iphoto; a photoreceptor circuit PRC to generate a photoreceptor signal Vpr dependent on the light intensity; and a memory capacitor C1 to remember past photoreceptor signal. The photosensor PD and photoreceptor circuit PRC constitute the photoreceptor module PR.

2. Memory capacitor C1: Receives the photoreceptor signal Vpr such that first plate of the capacitor carries a charge that is responsive to the photoreceptor signal Vpr and thus the light received by the photosensor P1). A second plate of the memory capacitor C1 is connected to the comparator node (inverting input) of A1. Thus the voltage of the comparator node, Vdiff, varies with changes in the photoreceptor signal Vpr.

3. Comparator A1: This is a means to compare the difference between current photoreceptor signal Vpr and past photoreceptor signal to a threshold. This comparator A1 can be in each pixel, or shared between a subset (for example a column) of pixels. In the preferred embodiment the comparator will be integral to the pixel, with each pixel having a dedicated comparator A1.

4. Memory: Memory 50 stores the comparator output based on a sample signal from the controller 60. Memory can be a sampling circuit (for example a switch and a parasitic or explicit capacitor) or a digital memory circuit (a latch or a flip-flop). In one embodiment, the memory will be a sampling circuit and each pixel will have two memories.

5. A conditional reset circuit R1: Condition for reset is a combination of the state of the memorized comparator output and a reset signal applied by a controller.

6. Peripheral circuit components: The comparator A1 and the memory 50 can be located in the pixel or in peripheral circuits (outside the pixel circuit).

The peripheral circuits contain a controller 60 which applies threshold signals to the comparator A1, sends control signals to memory 50 and selects times when the conditional reset circuit R1 becomes active.

The peripheral circuits may also contain a readout circuit RO which reads the content of the memory 50, determines if the light intensity for a given pixel has increased, decreased, or unchanged, and sends the output (computed from the current memory value) to a processor.

In more detail, the comparator tells if light has increased/decreased. For Off event: if Vdiff is lower than the threshold Voff (on Vb), the comparator output is high, and this level is stored in the memory. This means a decrease is detected. If Vdiff is not lower than the threshold, the comparator output is low: no decrease detected.

The only difficulty is that for On event, a low comparator output means an increase, while high means no change; but for Off event high comparator output means decrease while low means no change.

So the readout must know the memory content and which threshold was applied. Or, as in the preferred embodiment, described later, there is an inverter for On so that the memory polarity is the same for both on and off.

In one preferred embodiment of the pixel circuit 100 of the present invention, each pixel circuit 100 contains one comparator only, which sequentially acts first as comparator for ON-events, then as comparator for OFF-events (or vice-versa).

The pixel circuit 100 and controller 60 operate as follows.

A change in light intensity received by the photosensor PD will translate to a change in photoreceptor signal Vpr. When the reset circuit R1 is not conducting, the changes in Vpr will be reflected also in the voltage Vdiff at a comparator node at the inverting input (−) to the comparator A1. This occurs because the voltage across the memory capacitor C1 stays constant.

At times selected by the controller 60, the comparator A1 compares the voltage at the comparator node at the second terminal of the memory capacitor C1 (Vdiff) to a threshold voltage Vb (from controller) applied to the non-inverting input (+) of the comparator A1.

The controller 60 operates the memory 50 to store the comparator output Vcomp. The memory 50 is typically implemented as part of the pixel circuit 100 as shown. In other embodiments, however, the memory 50 is implemented as part of column logic circuit (peripheral circuit, one per each column of the pixel array).

If the state of the stored comparator output held in the memory 50 indicates a change in light intensity AND the global reset signal GlobalReset signal from the controller 60 is active, the conditional reset circuit R1 is conducting. Here "AND" indicates the logical AND operator. With the conditional reset circuit R1 in a conductive state, the voltage at the comparator node at the inverting input of the comparator A1 (Vdiff) is reset to a known level. Thus, it stores the current photoreceptor signal Vpr on the memory capacitor C1.

Figure 2:
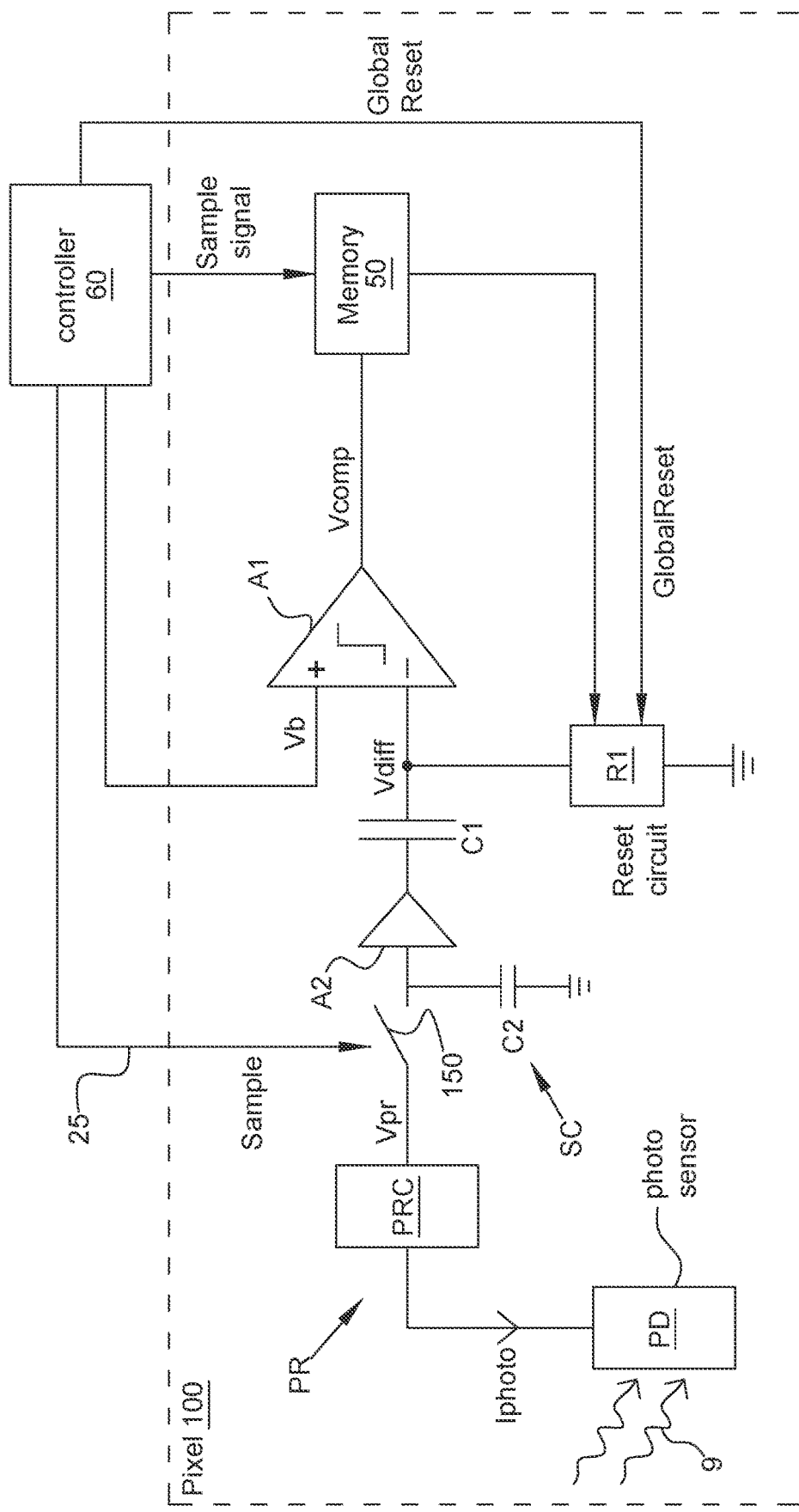
FIG. 2 is a circuit diagram showing an alternate embodiment of a pixel circuit with an optional sampling circuit.

FIG. 2 shows a pixel circuit 100 according to another embodiment which includes an optional sampling circuit SC between the photoreceptor circuit PRC and the memory capacitor C1. The sampling circuit SC allows the selective electronic connection or disconnection of the output Vpr of the photoreceptor circuit PRC and the memory capacitor C1.

The sampling circuit SC is operated by a sample signal 25 from the controller 60 to globally sample the photoreceptor output of all pixels at the same moment to avoid motion artifacts. Typically, the sampling circuit SC may comprise a sampling switch 150, a parasitic or explicit sampling capacitor C2, and a buffer amplifier A2. (Note, the buffer amplifier A2 is not used in all implementations.)

The pixel circuit 100 and controller 60 operate as follows.

A change in light intensity will translate to a change in photoreceptor signal Vpr as in the previous embodiment of FIG. 1.

At the same time, the controller 60 operates the sampling circuit SC by electrically connecting the photoreceptor circuit SC to the sampling capacitor C2. The controller 60 further operates the sampling circuit SC by then disconnecting the photoreceptor output voltage Vpr from the capacitor C2 by opening switch 150 via the control signal 25.

At times designated by the controller 60, the comparator A1 compares Vdiff at the comparator node to a threshold Vb applied on its non-inverting input. At the same time, the controller 60 operates the memory 50 to store the comparator output Vcomp. As before, the memory 50 is located in either the pixel circuit 100 or in the column logic circuit 44 of the peripheral RO circuit 42 as described later.

If the state of the stored comparator output indicates a change in light intensity AND the global reset signal Global-Reset (controlled by the controller) is active, the conditional reset circuit R1 is conducting, and Vdiff is reset to a known level, then the voltage on sampling C2 is memorized on memory C1.

As mentioned, a pixel or a pixel array can be used as a sensor for machine vision applications. In the machine vision applications, the output of the sensor will go (directly or indirectly) to the data processor where an algorithm can calculate the position and movement of the sensor or of an object being analyzed by the sensor.

A conventional sensor outputs images containing pixel values that represent the light intensity impinging on the pixels. In contrast, the sensor here outputs the addresses (where the address of a pixel corresponds to its row and column number) of those pixels where a light intensity change has been detected. This light intensity change at a given pixel is called an event. More specifically, the term 'event' means that the photoreceptor signal representing and being a function of light intensity of a pixel has changed by an amount greater than or equal to a threshold applied by the controller. To transmit an event, the address of the corresponding pixel is transmitted; along with a bit to indicate if the light intensity change was positive or negative.

To detect light intensity changes between current and previous instances in time, each pixel needs to store a representation of the light intensity at the previous instance in time.

More concretely, each pixel stores a voltage Vdiff representing the difference between the photoreceptor signal at the time of the last event emitted at this pixel and the current photoreceptor signal at this pixel.

To detect events in the preferred embodiment, Vdiff at the comparator node is first compared to one threshold to detect an increase in light intensity (ON-event), and the comparator output is sampled on a (explicit or parasitic) capacitor or stored in a flip-flop. Then Vdiff at the comparator node is compared to a second threshold to detect a decrease in light intensity (OFF-event) and the comparator output is sampled on a (explicit or parasitic) capacitor or stored in a flip-flop. A global reset signal is sent to all the pixels, and in each pixel this global reset signal is logically ANDed with the sampled comparator outputs to reset only those pixels where an event was detected. Then the sampled comparator output voltages are read out, and the corresponding pixel addresses sent to the receiver.

Figure 3:
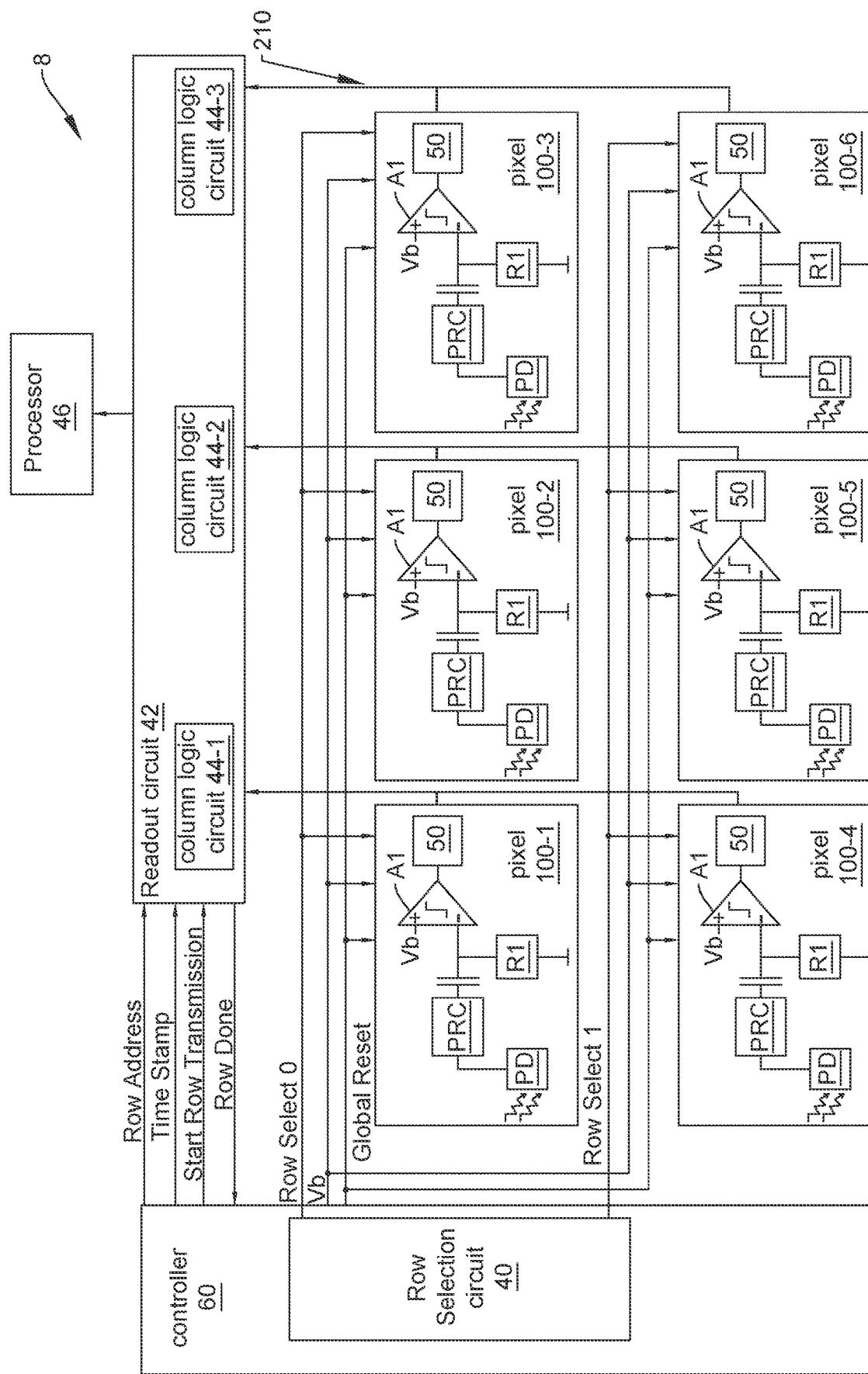
FIG. 3 is schematic diagram showing the layout of sensor with pixels arranged in a two-dimensional pixel array of rows and columns.

FIG. 3 shows a sensor 8 comprising a two-dimensional array of pixels 100-1 through 100-6. The illustrated sensor shows only two rows and only three columns to avoid cluttering the figure. In practice the sensor 8 would comprise of m rows (typically much greater than 2) and n columns (typically much greater than 3) of pixels. A pixel in a two dimensional array can be identified by its address which is the pixel's row number and column number. E.g., pixel 103-6 has row 2 (counting from top) and column 3 (counting from left) as its address.

The controller 60 controls pixels 100 and the other components such as the row selection circuit 40, the readout circuit 42, and transmission of data from the array to the processor 46.

In the illustrated example, the row selection circuit 40 is shown as part of the controller 60. This row selection circuit 40 selects one or multiple subsets of rows. When a row of pixels 100 is selected, the comparator outputs of the pixels in the selected row are conveyed to the readout circuit 42.

The readout circuit 42 reads the data (the memorized comparator outputs) from the pixel array. Often the readout circuit 42 will further encode this data into a more efficient representation before transmitting to some kind of receiver (usually a form of processor) which can be external to the sensor chip, such as processor 46.

The readout circuit 42, divided into several column logic circuits 44-1 through 44-n, where there are n columns, determines from reading comparator outputs if the light intensity for the corresponding pixel has increased, decreased or remained unchanged.

The controller 60 preferably operates the sensor 8 in multiple phases (FIGS. 4A and 4B) as enumerated below:
1. Integration of illumination changes: In this embodiment, the integration of changes continues during the other phases with no additional dedicated time requirement.
2. Comparison for ON-events phase (218 in FIGS. 4A and 4B): In each pixel, the comparator A1 is used to compare the integrated illumination change against an ON-threshold, the result is stored in memory 50.
3. Comparison for OFF-events phase (220 in FIGS. 4A and 4B): In each pixel the comparator A1 is used to compare the integrated illumination change against an OFF-threshold; the result is stored in memory 50.
4. Reset phase (222 in FIGS. 4A and 4B): Each pixel circuit 100, where the state of the stored comparators output indicates a change in light intensity, is reset by making the respective reset circuits R1 conducting.
5. Readout phase (224 in FIGS. 4A and 4B): Under control of the row selection circuit 40, the stored comparison results in the memories 50 are read out of the pixel array.

In general, the first phase (integration of illumination changes) does not need to have explicit time duration because the continuous-time integration of changes does not stop during the other phases. Thus it is possible to omit an explicit time allocation for this phase.

Of course, the order of comparison of ON- and OFF-events can be reversed. Furthermore, depending on the pixel embodiment, the readout phase can happen before the reset phase.

The controller 60 preferably controls the relative timing of the phases and creates the necessary signals to control the pixels. Several pixel operation modes are possible as shown in FIGS. 4A and 4B.

Fixed readout time: FIG. 4A is a timing diagram showing a fixed time mode where each of the operation phases has a fixed time duration. Thus the frame rate is fixed. In the illustrated example, each Evt frame is 100 microseconds long.

The readout phase thus also has a fixed duration, but the number of events to read out will most likely change from event-frame to event-frame. To keep a reasonable limit of time duration of the readout phase, the number of events that can be read 214 in a single event-frame must be limited. If the number of events to read out is less than the maximum possible, there will be an idle phase.

If the number of events is larger than what can be read out during the readout phase, there are three options: 1) notify the processor 46 and discard the additional events; 2) notify the processor 46 and enlarge the readout phase just for the current frame (after the stretched frame, the sensor, i.e., the pixel array, immediately starts the next event-frame); or 3) notify the processor 46 and enlarge the readout phase for the current frame and, after the stretched frame, wait for an "official" frame start time to remain synchronized with previous event-frame start time.

FIG. 4A shows an illustrative example timeline of operation for an example frame rate of 10 k event-frames per second or 100 microseconds per frame.

In more detail, in each event frame 212, the comparison of the ON-events 218 consumes 10 µs and the comparison of OFF-events 220 also consumes 10 µs. Then the pixels are reset during a 20 µs phase 222. Finally the events are read out of the pixel array 210 in a readout phase 224 and accumulated in the readout circuit 42. The readout phase lasts 60 µs. Thus, the sum of the durations of phases is 10+10+20+60=100 microseconds, in the specific example.

As illustrated among the successive event frames 212-1, 212-2, 212-3, the actual readout 214 in phase 224 consumes varying amounts of time, although this phase 224 is allotted 60 µs. E.g., for the event readout 214-1 in phase 224-1 for the first event frame 212-1, less than half of the 60 µs allotted for 214-1 is consumed. In contrast, for the third event frame 224-3, the readout of the events 214-3 consumes two thirds of the 60 µs allotted for 224-3.

Variable readout time: In the variable readout time mode, shown in FIG. 4B, the duration of the readout phase 224 depends on the number of events to be transmitted. As a result, the overall length of one frame and thus the frame rate are variable and depend on the number of events per frame.

In more detail, as in the previous example, each of the event frames 212 is divided into a comparison of ON-events 218, which consumes 10 µs, and a comparison of OFF-events 220, which also consumes 10 µs. The event reset phase 222 consumes 20 µs in each event frame 212. On the other hand, the event readout phase 224 for each of the event frames 212 is variable in length. As a result, this phase has a length of time that is dictated by the number of events 214 that needs to be readout from the pixel array 210.

Figure 5:
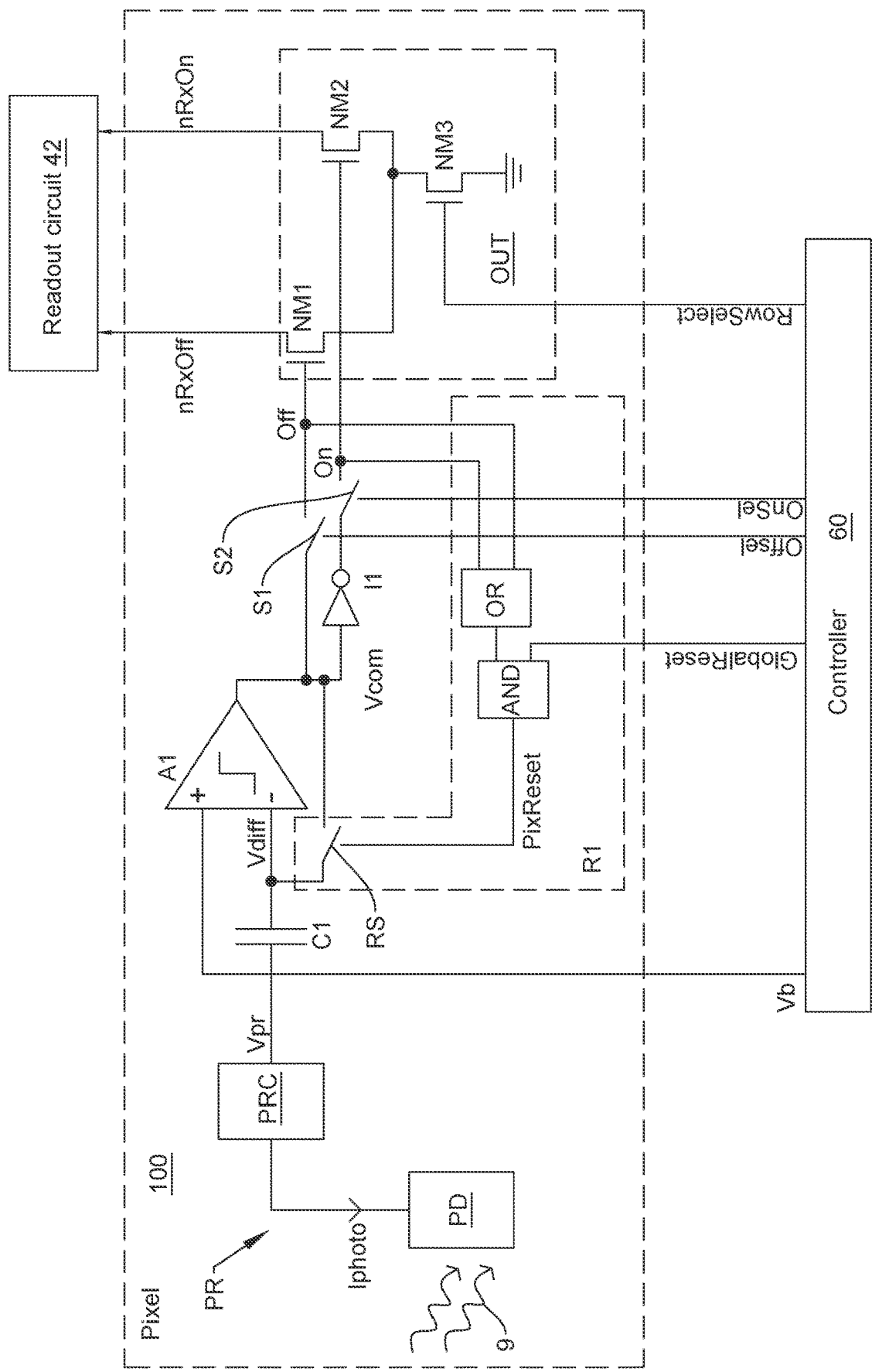
FIG. 5 is a circuit diagram showing the components of the preferred embodiment of the pixel circuit without sampling.

FIG. 5 shows a pixel circuit 100, the preferred embodiment without sampling, which has been constructed according to the principles of the present invention.

A photosensor PD, such as a photodiode or a phototransistor or photo active region, is used to convert impinging light 9 into an electrical signal (i.e., current, designated as Iphoto, or a charge). Iphoto is then converted into a voltage Vpr by the photoreceptor circuit PRC. The relationship of Vpr to intensity of light is typically logarithmic, but could also be linear, in this and all other pixel embodiments.

Preferably, the photoreceptor module PR in each of the one or more pixels of any of the sensor embodiments is a logarithmic photoreceptor module. A logarithmic photoreceptor module is a photoreceptor that is configured to convert the Iphoto current, which is proportional to the intensity of light impinging on the sensing surface of the photosensor PD, into a signal that is a logarithmic function of the detected light. Note although Vpr is chosen to be logarithmic with respect to Iphoto, it could have been chosen to be proportional to Iphoto and other function.

A logarithmic conversion from the current generated by the photodiode (iphoto) into the output voltage is very powerful because it allows mapping a wide range of input currents onto a limited voltage range. Comparing differences in the logarithmic intensity domain also has the advantage that it is mathematically similar to comparing normalized differences; most definitions of contrast are based on normalized differences (e.g., luminance ratio, Weber contrast or Michelson contrast). Comparing differences in the logarithmic intensity domain also allows observing differences in the reflectance of objects independent of the background illumination.

The memory capacitor C1 receives the photoreceptor signal Vpr such that first plate of the capacitor carries a charge that is responsive to the photoreceptor signal Vpr. A second plate of the memory capacitor C1 is connected to the comparator node A1. In the illustrated embodiment, the second plate is connected to the inverting input of the event comparator A1. Thus the voltage of the comparator node, Vdiff, varies with changes in the photoreceptor signal Vpr and thus the light received by the photosensor PD.

During the comparison phases (e.g., see FIGS. 4A and 4B), the reset switch RS of the reset circuit R1 is not conducting, thus voltage Vdiff of the comparator node is floating. Changes in the photoreceptor signal Vpr thus change the voltage of the floating comparator node Vdiff since the voltage across the memory capacitor C1 remains constant from the time when the pixel 100 was reset.

Figure 6:
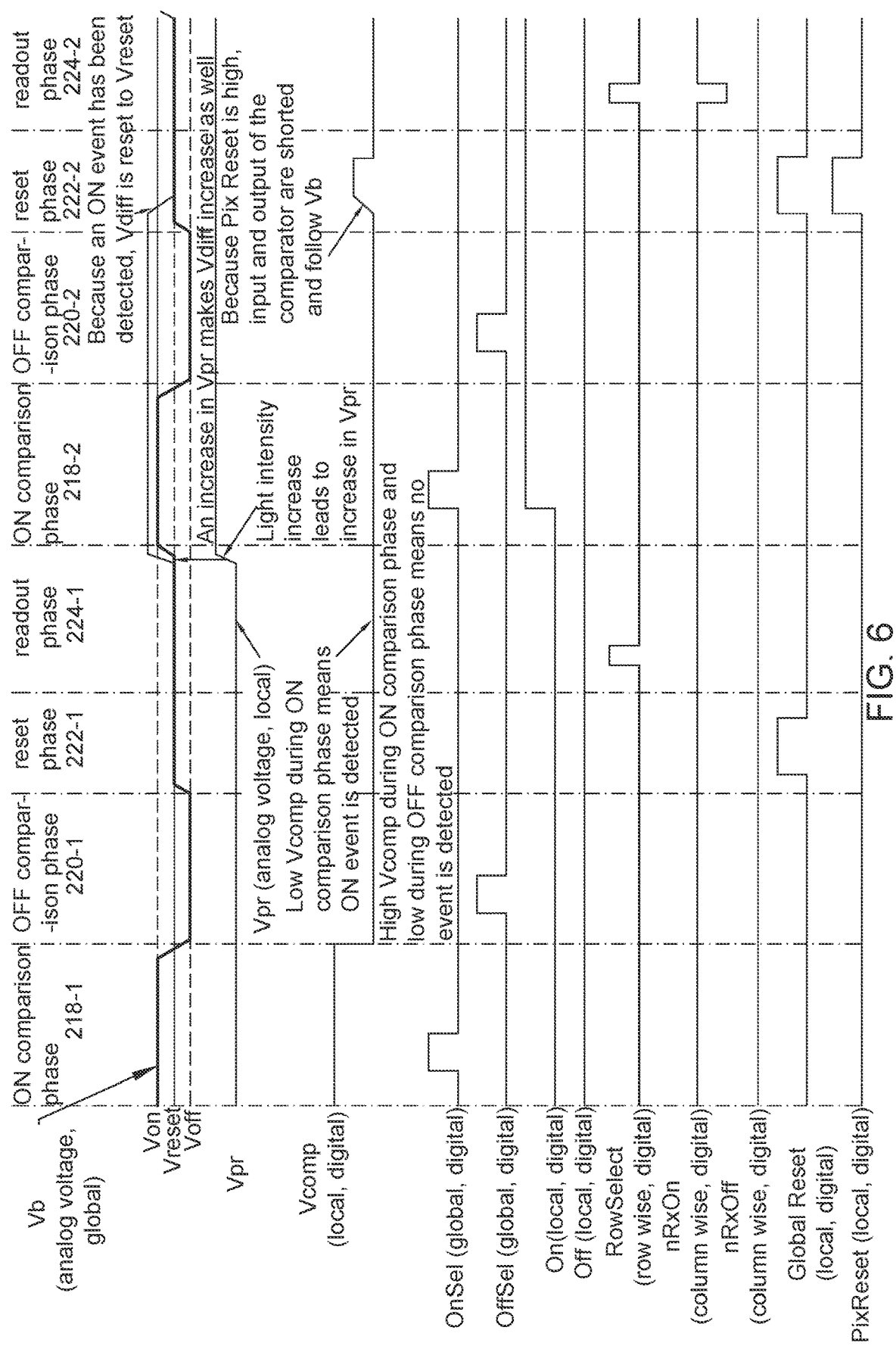
FIG. 6 shows the time lines of signals; the horizontal time axis corresponds to duration and time of occurrence of phase operations which are labeled on top.

For comparison of ON-events, the threshold voltage Vb is set by the controller 60 to value Von (see FIG. 6). The event comparator A1 thus compares the threshold voltage Vb to Vdiff. The controller 60 also pulses OnSel (for ON select) which closes the ON-event sampling switch S2. As a result, the comparator output is inverted by inverter I1 and sampled on a capacitance. In the illustrated embodiment, this capacitance is a parasitic gate capacitance of ON-event output transistor NM2 of the output circuit OUT.

For comparison of OFF-events, the bias voltage Vb is set to value Voff (see FIG. 6). The event comparator A1 thus compares the new threshold voltage Vb to the Vdiff. The controller 60 also pulses OffSel which closes the OFF-event sampling switch S1. As a result, the comparator output is sampled on a capacitance. In the illustrated embodiment, this capacitance is a parasitic gate capacitance of OFF-event output transistor NM1 of the output circuit OUT.

During the reset phase, the threshold voltage Vb is set to a voltage level Vreset (a value in between Von and Voff, preferably in the middle between Von and Voff) and the GlobalReset signal is activated by the controller 60. As a result, the reset circuit R1 will close the reset switch RS if either ON-event or an OFF-event was detected (using the OR gate) AND GlobalReset is active.

Thus, only those pixels where an event has been detected are reset. The reset function advantageously allows slow movements to be detected because small changes from frame to frame can be accumulated.

The illustrated example circuit also compensates for any offset in the event comparator A1 and thus helps to make the response of the pixels 100 in the pixel array 8 (FIG. 3) consistent across the array. In general, in those pixels 100 within the pixel array 8 where a high voltage level is stored on either OFF-event output transistor NM1 or ON-event output transistor NM2, the reset switch RS is closed. As a result of the voltage-follower configuration that arises, Vdiff at the second terminal of the memory capacitor C1 will settle at Vreset plus any offset of the comparator. As a result, the correction that is applied to the threshold is now compensated for the offset in the event comparator A1.

During the readout phase, the pixel array is read out by row. Thus, each pixel circuit 100 waits for the controller 60 to activate its RowSelect (row selection) signal one row at a time.

Pixel control signals and their change with time (time line plots) are discussed next.

FIG. 6 shows the timeline of the global pixel control signals and local pixel signals. Vb, OnSel, OffSel and GlobalReset are global signals for all pixels in the pixel array, whereas RowSelect is a row-wise (local) signal.

In more detail, two event frames with ON- and OFF comparison phase are shown. Specifically, during the comparison phase 218-1 and the OFF comparison phase 220-1, the threshold voltage Vb is changed between Von and Voff levels. Since the photoreceptor signal Vpr is constant, no event is detected.

During the ON comparison phase 218-2, the threshold voltage Vb is changed to the Von. Since the photoreceptor signal Vpr now at a higher level, indicating that the amount of light received by the photosensor PD has increased, the voltage at the second terminal of the memory capacitor C1 (Vdiff) also increases (above the level of Von if the change is sufficiently big). As a result, when the controller 60 also pulses OnSel, the ON-event sampling switch S2 closes and ON signal is stored on the capacitance of the ON-event output transistor NM2 (FIG. 5). When the RowSelect signal is active, the nRxOn line is pulled low.

Because an event is detected, the reset phase also resets the voltage across the memory capacitor C1. Specifically, in the reset phase 222-2, the threshold voltage Vb is set to an intermediate level Vreset. Since PixReset is high because of the logic in the reset circuit 11, Vdiff is reset to Vreset and a new voltage is stored across the memory capacitor C1.

Figure 7:
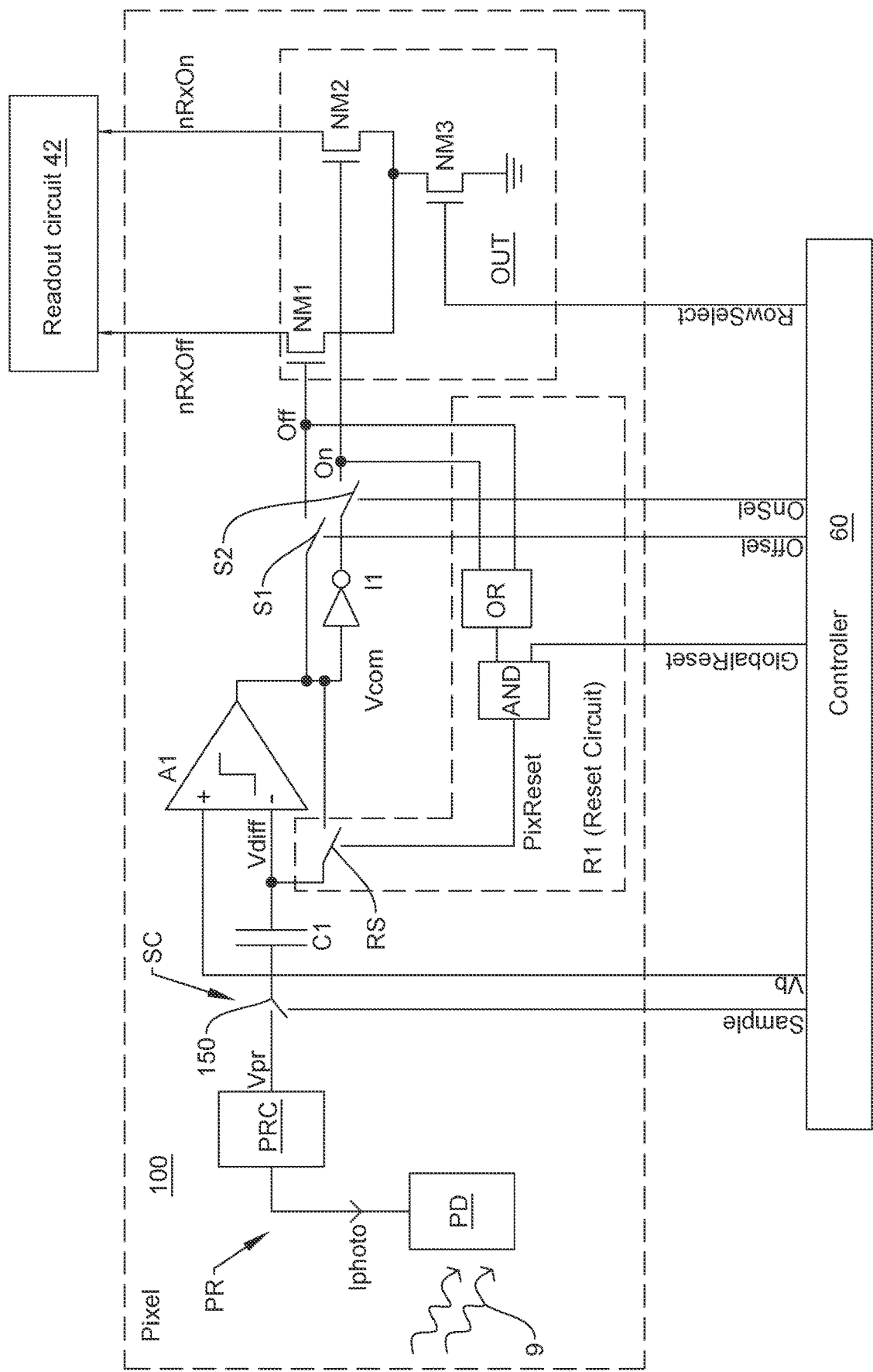
FIG. 7 is a circuit diagram showing the components of the preferred embodiment of the pixel circuitry with sampling.

FIG. 7 shows another pixel circuit 100 (FIG. 5) with a sampling circuit SC between the photoreceptor PR and the memory capacitor C1.

This enables the photoreceptor signal Vpr to be sampled before comparison. This configuration ensures that the same value of the photoreceptor voltage is used for comparison for ON and OFF-events, avoiding possible motion artifacts due to the change of Vpr in between the comparison for ON-events and OFF-events.

In more detail, before each ON comparison phase 218, the sample line from the controller 60 is active for a short period to close the sampling switch 150. This transfers the photoreceptor signal voltage Vpr to the plate of the memory capacitor C1. Then the sample signal line from the controller 60 goes inactive such that the sampling switch 150 is open again. Thus, the charge on the left plate of the memory capacitor C1 is static and will not change with subsequent changes in the photoreceptor signal Vpr. Such changes would typically result from changes in the scene or move between the sensor and the scene.

Then, both the ON comparison phase 218 and the OFF comparison phase 220 are performed. The respective comparisons against the different threshold voltages Vb will then occur relative to the same voltage that was sampled from the photoreceptor signal Vpr.

Figure 8:
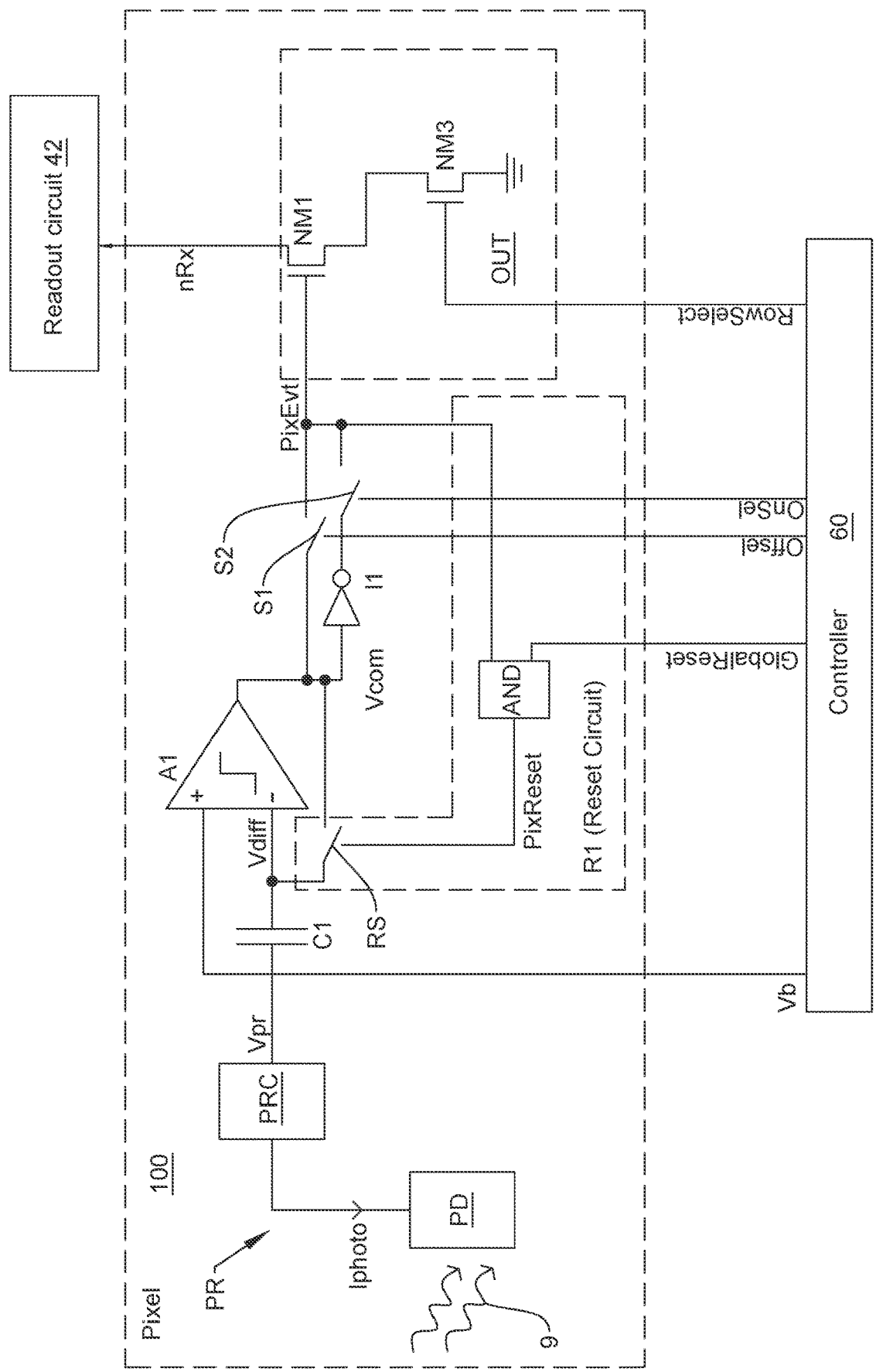
FIG. 8 is a circuit diagram showing the components of a smaller and simpler pixel circuit embodiment, compared to previous ones.

FIG. 8 shows another pixel circuit 100. This design results in a smaller pixel.

More specifically, it has just one output line nRX, which replaces the two output lines nRXon and nRXoff employed in the previous examples (FIGS. 5 and 7). This change further allows for the removal of the OR-gate (see FIGS. 5 and 7) in reset circuit R1, and the removal of NM2, one of the output transistors (see FIGS. 5 and 7) in of the output circuit OUT. For both event polarities, the output signal nRx is active low. The reset circuit R1 uses the GlobalReset signal and the sampled comparator outputs to determine if it is conducting or not.

In this embodiment, it is preferable to have a reset phase for each event polarity separately (i.e., one reset phase for OFF-event and another for ON-event).

In more detail, similar to the previous embodiments, changes in the photoreceptor output voltage Vpr change the voltage of the floating node Vdiff.

For the comparison for ON-events, the bias voltage Vb is set to a voltage level Von. The comparator compares Vb to Vdiff. By pulsing OnSel, the comparator output is sampled on the parasitic capacitance of transistor NM1.

For the reset due to ON-events, Vb is set to a voltage level Vreset (in the middle between Von and Voff) and the GlobalReset signal is activated. In those pixels where a high voltage level is stored on output transistor NM1, the reset switch RS is closed and thus Vdiff will settle at Vreset plus the offset of the comparator.

For the readout of ON-events, row by row, the RowSelect signal is activated for one row at a time. If the gate capacitance of output transistor NM1 is storing a high voltage level, output transistor NM1 is conducting and the corresponding request line nRx is pulled down. This active-low request is latched in peripheral readout circuit 42.

For comparison for OFF-events, the bias voltage Vb is set to a level Voff by the controller 60. By pulsing OffSel, this new comparator output is sampled on the parasitic capacitance of output transistor NM1.

For the reset OFF-events, Vb is set to a voltage level Vreset (in the middle between Von and Voff) and the GlobalReset signal is activated. In those pixels where a high voltage level is stored on the gate of output transistor NM1, the reset switch RS is closed and thus Vdiff will settle at Vreset plus the offset of the comparator.

For the readout of OFF-events, performed row by row, the RowSelect signal is activated for one row at a time. If the gate capacitance of the output transistor NM1 holds a high voltage level, it is conducting and the output line nRx is pulled down. This active-low request is latched in peripheral readout circuit 42.

Figure 9:
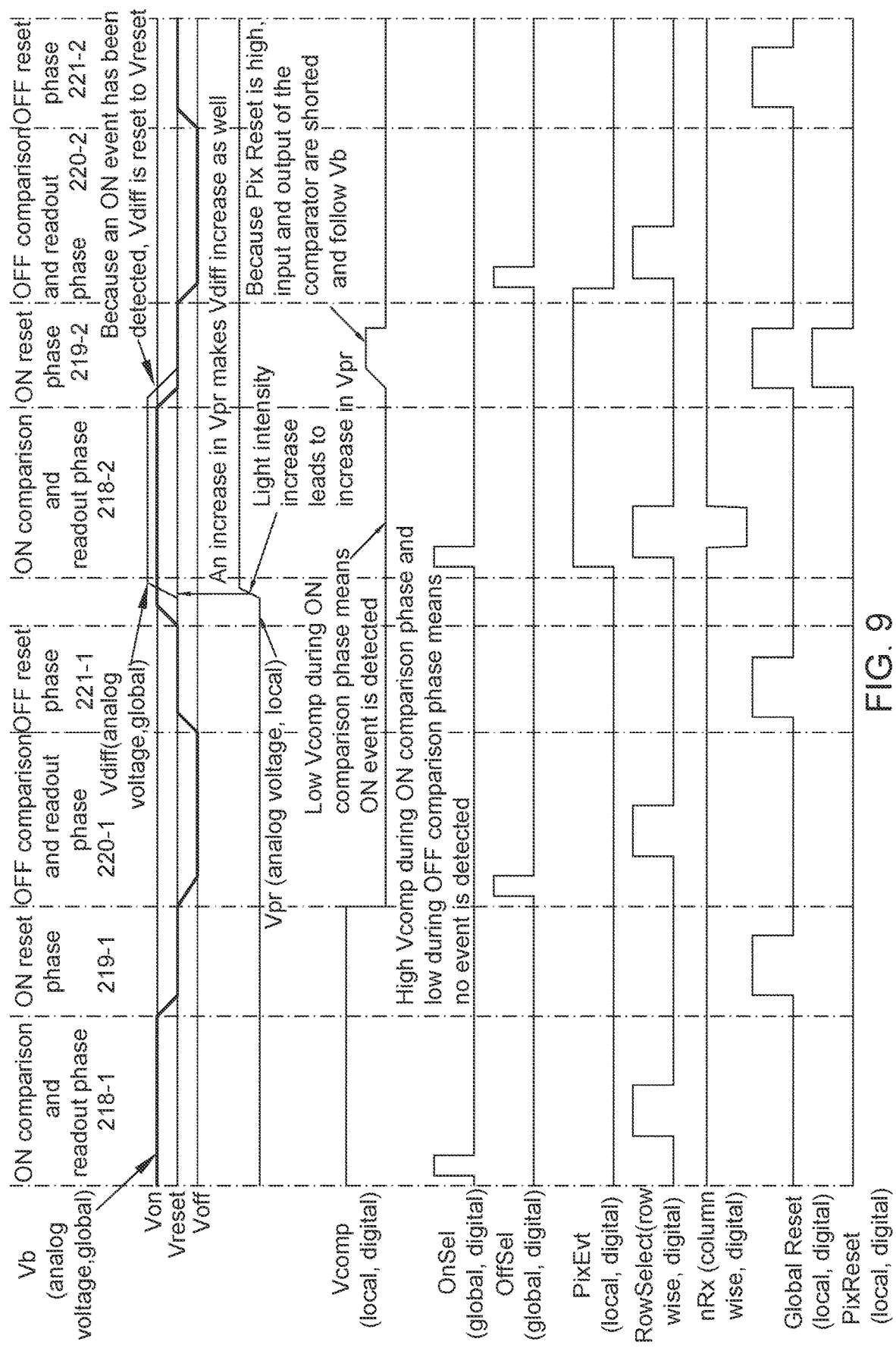
FIG. 9 shows the time lines of signals corresponding to the pixel circuit embodiment illustrated in FIG. 8.

FIG. 9 shows the timeline of the global pixel control signals and local pixel signals. Vb, OnSel, OffSel and GlobalReset are global signals; RowSelect is a row-wise (local) signal.

In the example, the ON comparison phase is combined with the readout phase 218. During this period, the threshold voltage Vb increases to Von and the RowSelect is active. But in the illustrated example phase 218-1, no ON-event is detected. Similarly, the OFF comparison phase is combined with the readout phase 220. During the ON reset phase 219 and the OFF reset phase 221, the GlobalReset signal is active.

Before the ON comparison and readout phase 218-2, Vpr increases due to increased light on the photosensor PD, and, as a consequence, Vdiff increases to a value greater than Von. Thus, the event comparator A1 registers an ON-event, which is stored in the memory when OnSel goes high and low again, and thus PixEvt goes high. When the row selection signal RowSelect is active, the ON-event is communicated to the peripheral circuit on the output line nRx. During the ON reset phase 219-2, while PixEvt and GlobalReset are simultaneously high, PixReset goes high so that the pixel is reset during reset phase 219-2.

Figure 10:
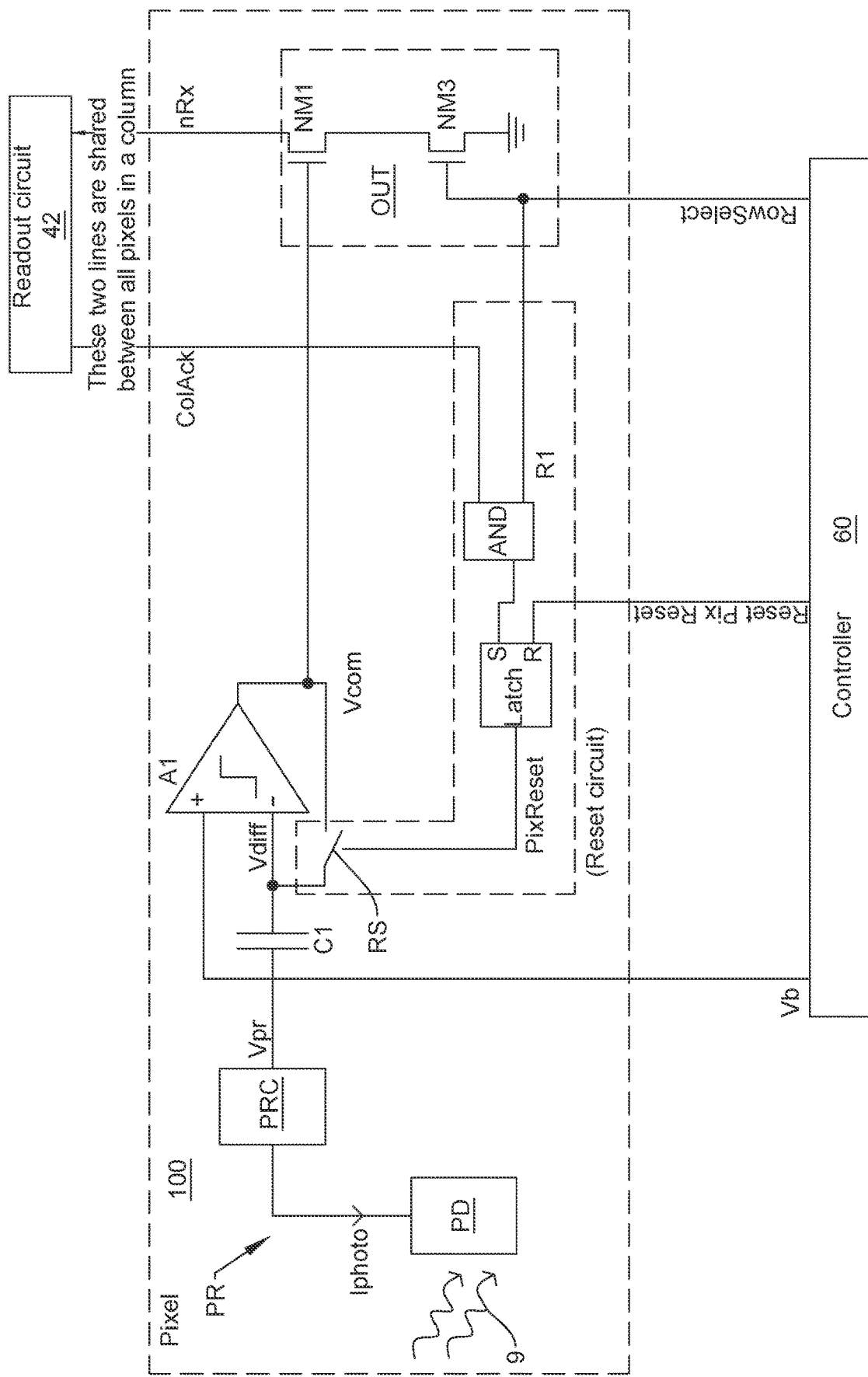
FIG. 10 is a circuit diagram showing the components of an even smaller and simpler pixel embodiment where the memory circuit is moved from pixel circuitry to the readout circuit.

FIG. 10 shows another pixel circuit 100. This design results in a still smaller pixel, where the memory function is not located in the pixel circuit 100, but instead is part of the readout circuit 42.

In more detail, the reset circuit R1 uses the RowSelect signal and an output acknowledge signal ColAck from the readout circuit 42 to determine whether to close reset switch RS and reset the memory capacitor C1. The logic AND of ColAck and RowSelect is used to set a latch to memorize the PixReset signal, a global signal from the controller (ResetPixReset) is used to reset the latch during the reset phase. The reason for storing the AND of ColAck and RowSelect and not using it directly to control the switch RS is so that all pixels in the array can be reset simultaneously. Without the latch, the reset would need to happen on a row-by-row basis during the readout phase.

The ColAck signal from the readout circuit 42 is shared between all pixels in a column. Thus the pixel reset has to be activated on a row-by-row basis. In operation, the row selection circuit selects one row of pixels by rendering the corresponding RowSelect active and the corresponding comparator outputs are conveyed to the readout circuit via the output transistor NM1. Then the controller 60 operates the memories in the readout circuit 42 to store the conveyed comparator outputs; the column logic circuits of the readout circuit 42 determine if there has been an increase or decrease in light intensity. In those columns, where the column logic circuit has detected a light intensity change, the ColAck signal is activated. The controller then applies the reset voltage Vreset to the positive inputs of the event comparators A1 of the array 210. Together with the still active RowSelect signal, an active ColAck signal resets the corresponding pixel.

In addition, in this pixel circuit, the polarity of the comparator output is different between an ON-event (increasing light level) and an OFF-event (decreasing light level). As a result, the difference of polarity of the comparator output for ON-events and OFF-events is accounted for in the readout circuit 42. This means the output signal nRx is active high for ON-events and active low for OFF-events.

Figure 11:
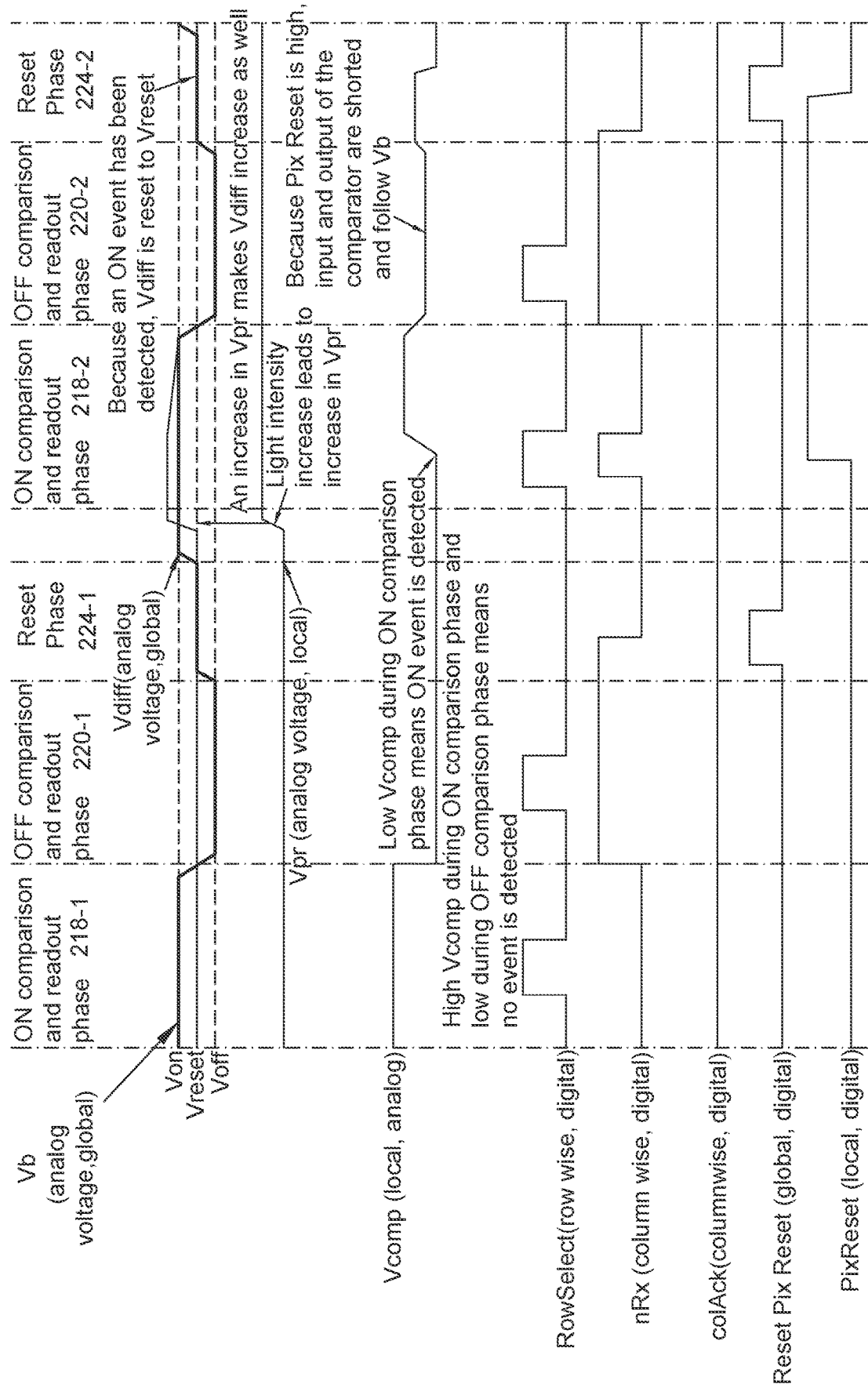
FIG. 11 shows the time lines of signals corresponding to the pixel circuit embodiment illustrated in FIG. 10.

FIG. 11 shows the timeline of the global pixel control signals and local pixel signals. Vb, OnSel, OffSel and ResetPixReset are global signals whereas RowSelect is a row-wise local signal and ColAck is a column-wise local signal.

In the example, the ON comparison phase is combined with the readout phase 218. During this period, the threshold voltage Vb increases to Von and the RowSelect is active. But in the illustrated example phase 218-1, no ON-event is detected. Similarly, the OFF comparison phase is combined with the readout phase 220. After the two comparison and readout phases, there is a reset phase 224.

Before the ON comparison and readout phase 218-2, Vpr increases due to increased light on the photosensor PD, and, as a consequence, Vdiff increases to a value greater than Von. Thus, the event comparator A1 registers an ON-event, which communicated to the peripheral circuit on the output line nRx when the row selection signal RowSelect is active. Because the corresponding column logic circuit registers an event, it will activate the ColAck signal. In all pixels where ColAck and RowSelect are simultaneously active, the PixReset signal goes high, shorting the input and the output of the comparator. During the reset phase 224-2, the controller applies Vreset to Vb and because PixReset is still high, the pixel is reset. Then the controller will set ResetPixReset high for some time to set all PixReset signals back to a low value.

Figure 12:
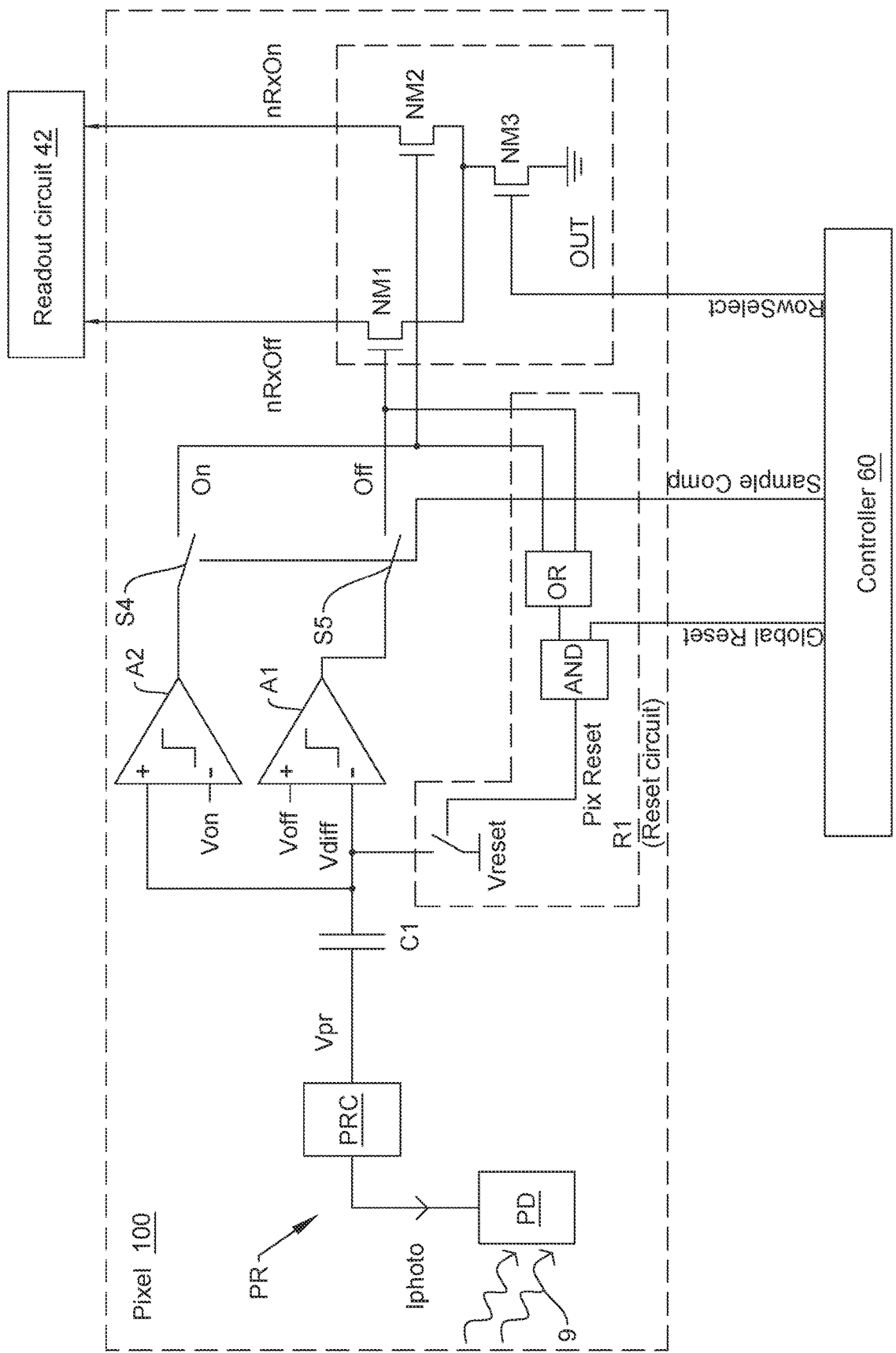
FIG. 12 is a circuit diagram showing another pixel embodiment with two comparators per pixel which can be faster than previous embodiments.

FIG. 12 shows another pixel circuit 100. This design allows for faster operation. It includes two event comparators per pixel, which enables the ON-event and OFF-event comparisons to take place simultaneously. In addition, the memory is located in the pixel circuit and is implemented by two sampling circuits at the corresponding comparator output. As in FIG. 5, memory is the combination of a switch with parasitic capacitance, here S4 and the parasitic gate capacitance of NM2, also S5 and parasitic gate capacitance of NM1. The comparator outputs are sampled and stored on the parasitic gate capacitance of the two output transistors NM1 and NM2.

In more detail, OFF-event comparator A1 receives a Voff threshold voltage that is provided to the entire pixel array 210. Similarly, ON-event comparator A2 receives a Von threshold voltage that is provided to the entire pixel array 210.

When sample comparison signal SampleComp from the controller 60 is active, the output of the comparators A1, A2 are transferred to the gate capacitances of the OFF-event output transistor NM1 and the ON-event output transistor NM2, respectively. Their state is then read via the output lines nRXon and nRXoff when RowSelect is active (i.e., NM3 is conductive).

In response to an ON-event or OFF-event, the reset circuit resets the voltage at the second terminal of the memory capacitor C1 (Vdiff), which is supplied to the inverting input of the OFF-event comparator A1 and the non-inverting input of the ON-event comparator A2. In this case, Vdiff is reset to the common voltage across the array 210.

Figure 13:
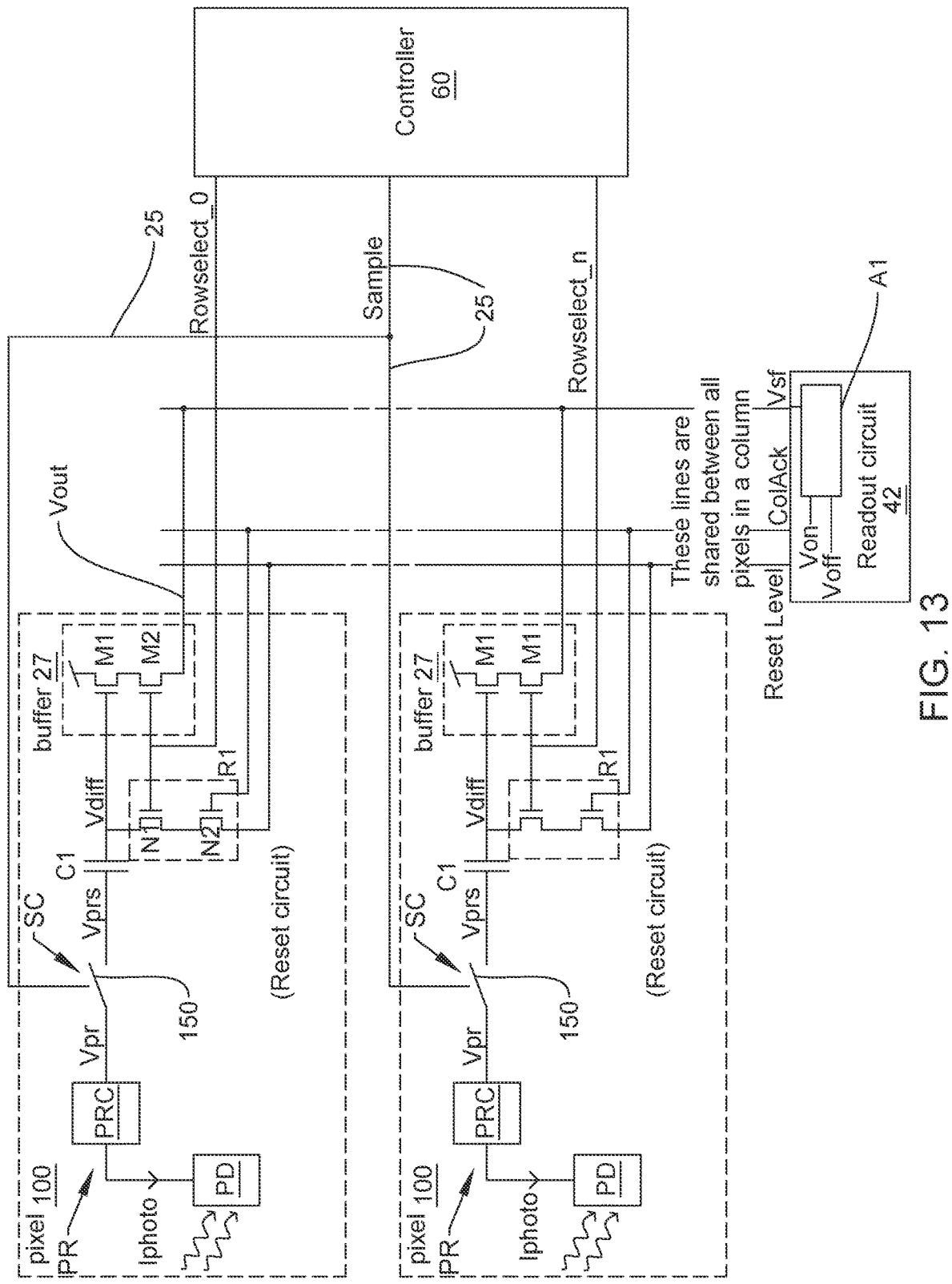
FIG. 13 is a circuit diagram showing a still smaller pixel size as the comparator function is moved from the pixel circuit to the readout circuit. (Note: the two pixels shown are along a column of the pixel array.)

FIG. 13 shows two representative pixels 100 along a column from the array 210. The ellipses (dots) along the ResetLevel, ColAck and Vsf lines indicate presence of other pixels along the column. They are omitted from the figure to avoid clutter. The pixel circuit embodiment of this figure results in a still smaller pixel. The reason is that comparator function is not located in the pixel circuit 100, but instead is made part of the readout circuit 42 (shown in bottom of the figure).

This pixel circuit 100 includes a sampling switch 150 between the photoreceptor circuit PRC, whose output is Vpr as discussed for other embodiments, and the memory capacitor C1. This allows the selective electronic connection of the output of the photoreceptor circuit PRC and the memory capacitor C1. The sampling switch 150 is operated by a sample signal Sample on line 25 from the controller 60. The sample signal is rendered active by the controller 60 to globally sample the photoreceptor output of all pixels 100) in the array 210 at the same moment. This avoids motion artifacts.

Specifically, the photoreceptor signal Vpr is transferred to the memory capacitor C1 as Vprs. A buffer 27 then holds voltage at the second terminal of the memory capacitor C1 (Vdiff). In general, the buffer 27 conveys the voltage (Vdiff) of the second terminal of the memory capacitor C1 to peripheral circuits. The buffer is enabled by a RowSelect signal coming from the row selection circuit 60.

The pixel circuit 100 uses a source follower as the buffer 27. This conveys the voltage on the second terminal of the memory capacitor C1 to the readout circuit 42 for the pixel's column in the array 210. The voltage Vdiff is provided on line Vout to the readout circuit to terminal Vsf of the readout circuit 42. There, an event comparator circuit A1 compares Vdiff to both the Von level and the Voff level. This column comparator A1 is located in the readout circuit 42.

Figure 37:
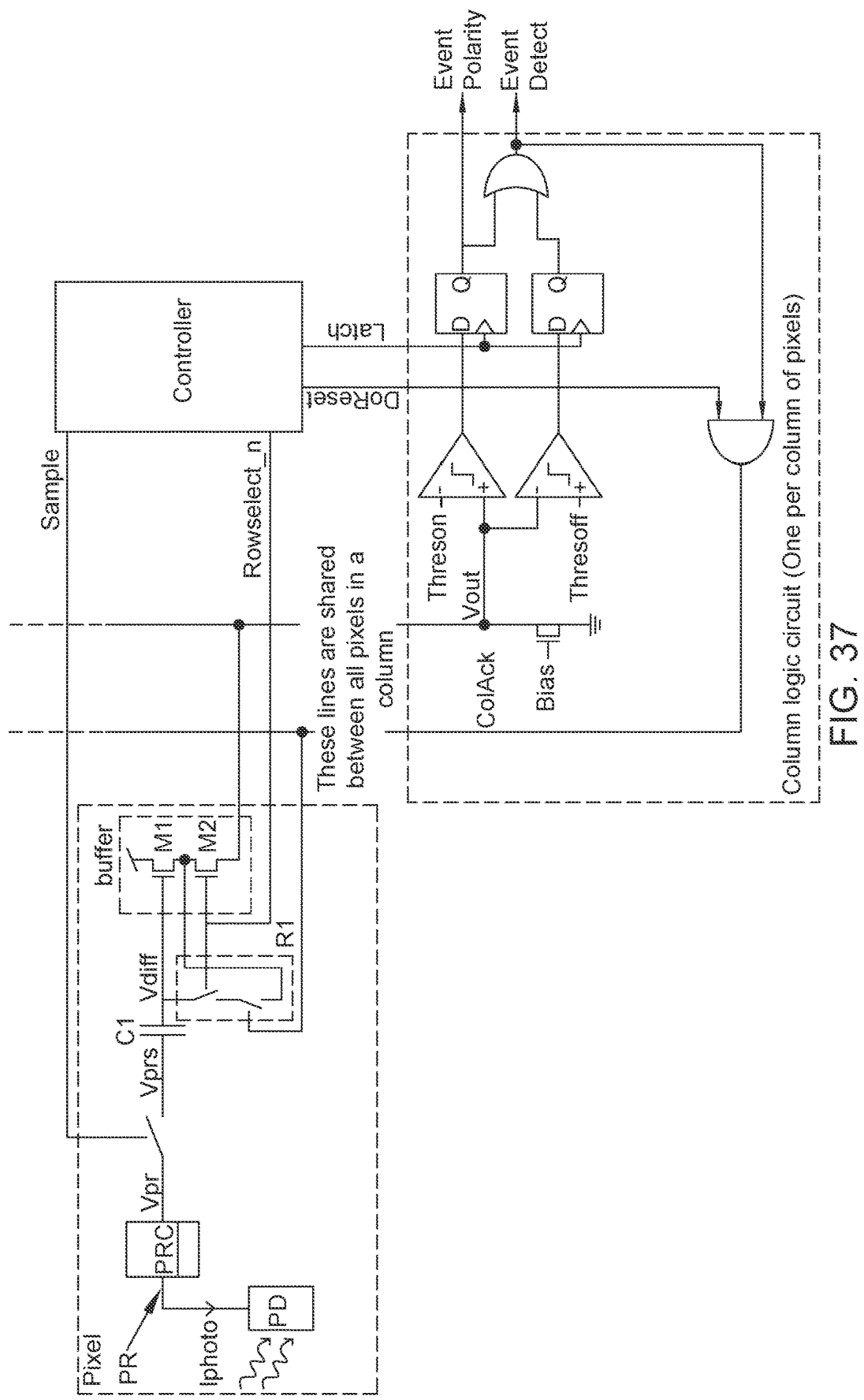
FIG. 37 shows column logic circuit implementation for the pixel circuit shown in FIG. 14.

In the buffer 27, transistor M1 acts as a unity gain source follower input transistor (the current source of the source follower is part of the readout circuit 42), while M2 is a switch to enable the source follower. The readout circuit 42 is implemented such that there is a separate ColAck signal for each column of pixels. The ColAck signal is active only in those columns where an event was detected (FIG. 37 shows such a readout circuit 42).

Reset transistor N1 is controlled by the RowSelect signal. Reset transistor N2 is controlled by the output acknowledge signal ColAck. Thus when both of these signals are active, the reset transistors N1 and N2 are conductive and the voltage at the second terminal of the memory capacitor C1 (Vdiff) is reset to a reset voltage supplied to the column of pixels 210 on reset lines ResetLevel from the readout circuit 42. The series connection of transistors N1 and N2 thus form a logic AND function for the signals RowSelect and ColAck.

It should be understood, that this embodiment could also be implemented without the sample switch 150 between photoreceptor circuit PRC and the memory capacitor C1.

Figure 14:
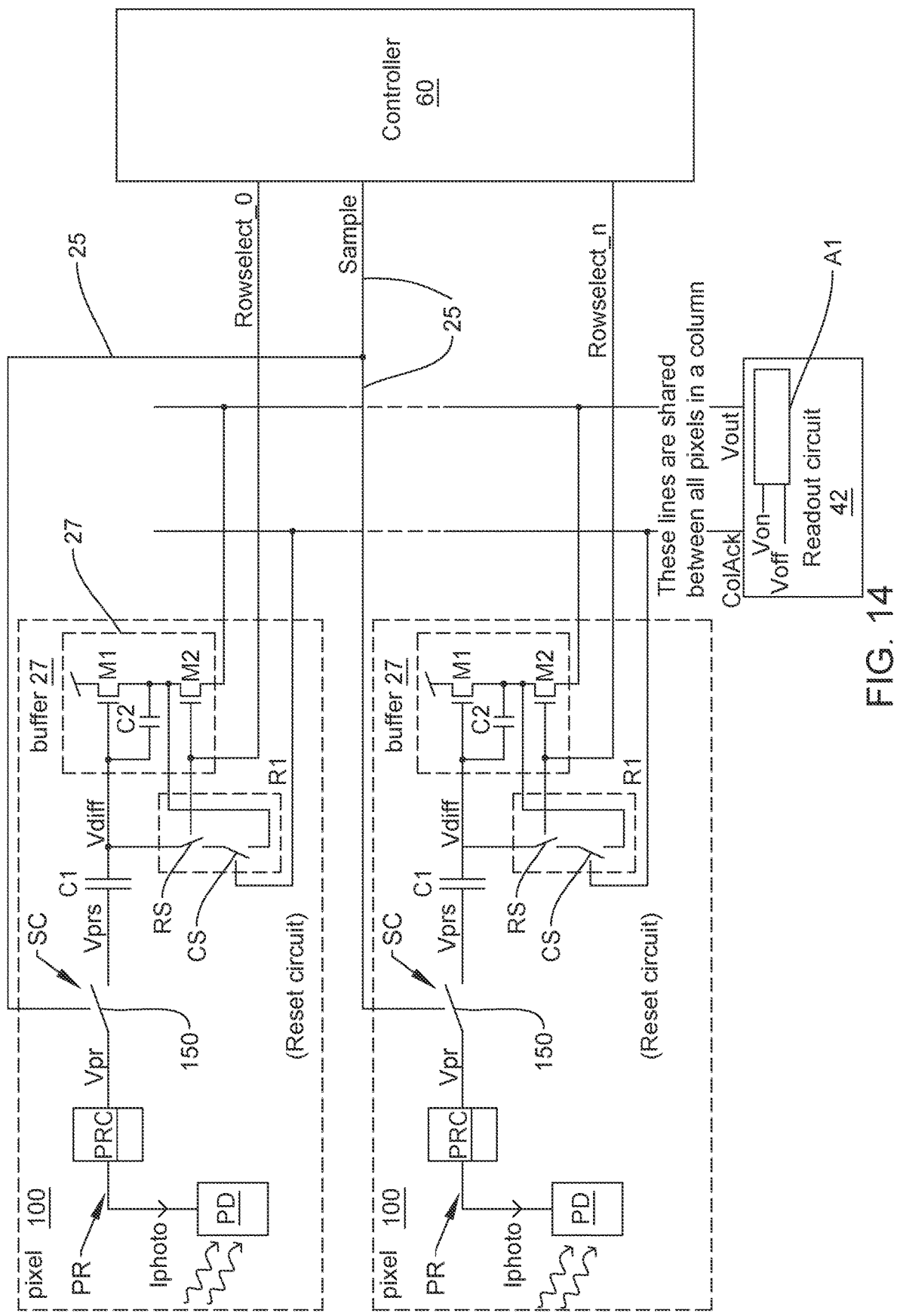
FIG. 14 depicts two pixels in a similar arrangement as in FIG. 13. In the figure the pixel circuit contains an amplification circuit to amplify change in pixel output.

FIG. 14 shows two representative pixels 100 along a column from the array 210. As in FIG. 13, the ellipses (dots) along the ResetLevel, ColAck and Vsf lines indicate presence of other pixels, omitted to avoid cluttering the figure. This design is also focused on small pixel area. As in the previous embodiment, the comparator function is not located in the pixel circuit 100, but instead is made part of the readout circuit 42. However, unlike the embodiment of FIG. 13, this embodiment uses a capacitive amplifier in the buffer 27 to amplify the voltage Vdiff at the second terminal of the memory capacitor C1 and specifically the change in voltage since the pixel was last reset.

Vdiff, before amplification, is obtained from Vprs as before (FIG. 13). Amplifying the changes of Vdiff facilitates detecting small changes in the photoreceptor signal Vpr. The gain of the buffer 27 is given by the ratio of the capacitances of C1 divided by C2. It should be noted that the capacitor C2 can be explicit or parasitic. Except for this multiplication by the ratio of capacitances, the embodiment and functioning of the pixel depicted in FIG. 14 is identical to that of FIG. 13.

In the buffer 27, transistor M1 is a PFET input transistor and thus the buffer is an amplifier, while M2 is a switch to enable the amplifier. The readout circuit 42 is implemented such that there is a separate ColAck signal for each column of pixels. The ColAck signal is active only in those columns where an event was detected. FIG. 37 shows such a readout circuit 42.

The reset of node Vdiff is controlled by a row selection switch RS, controlled by the RowSelect signal, and a column reset switch CS, controlled by the output acknowledge signal ColAck.

In FIG. 13 (along with FIG. 35), the reset level is determined by the source follower and A1 in the readout circuit. The actual reset level will contain the offset of the source follower and the offset of A1, and thus both of these offsets will be compensated.

In FIG. 14 (along with FIG. 37), A1 is implemented as two comparators (one for ON, one for OFF), so it is not possible to include both of them in the reset level. But because the buffer in FIG. 14 has a gain that is much bigger than unity, the offset of the comparators does not actually matter very much, so it can be left uncompensated.

Again like for FIG. 13, FIG. 14 could also be implemented without the sample switch 150 between photoreceptor circuit PRC and the memory capacitor C1.

Now the discussion will shift to cover possible example implementations of aspects/parts of the pixel circuit embodiments described above. It should be understood that, for the most part, any of the above-described circuits may have any one or more of following described features.

Figure 15:
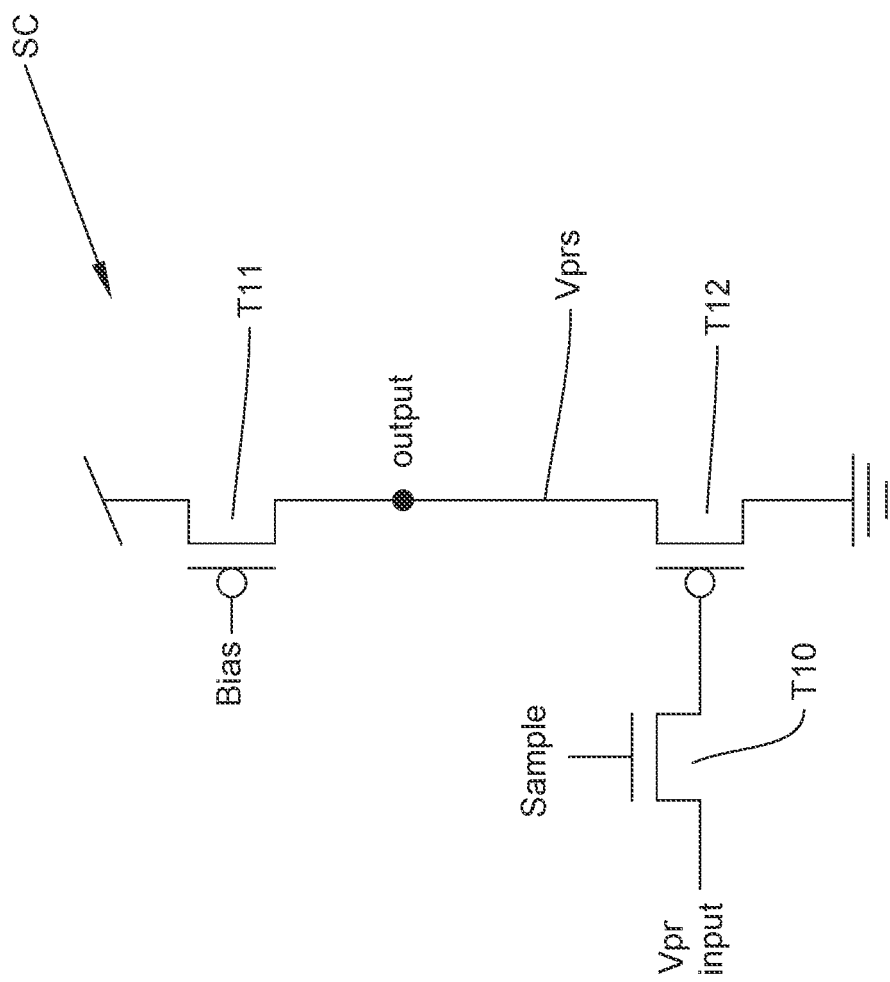
FIG. 15 is a circuit diagram showing an embodiment of a sampling circuit SC.

FIG. 15 shows a compact embodiment of the sampling circuit SC as might be used in the pixel embodiments (FIGS. 2, 7, 13 and 14). The sampling circuit SC uses an nFET transistor T10 as a switch and a source follower implemented by the two pFET transistors T11 and T12, where T11 is the current source of the source follower, while T12 is the source follower input transistor. The gate capacitance of the pFET transistor T12 forms the sampling capacitor.

Figure 16:
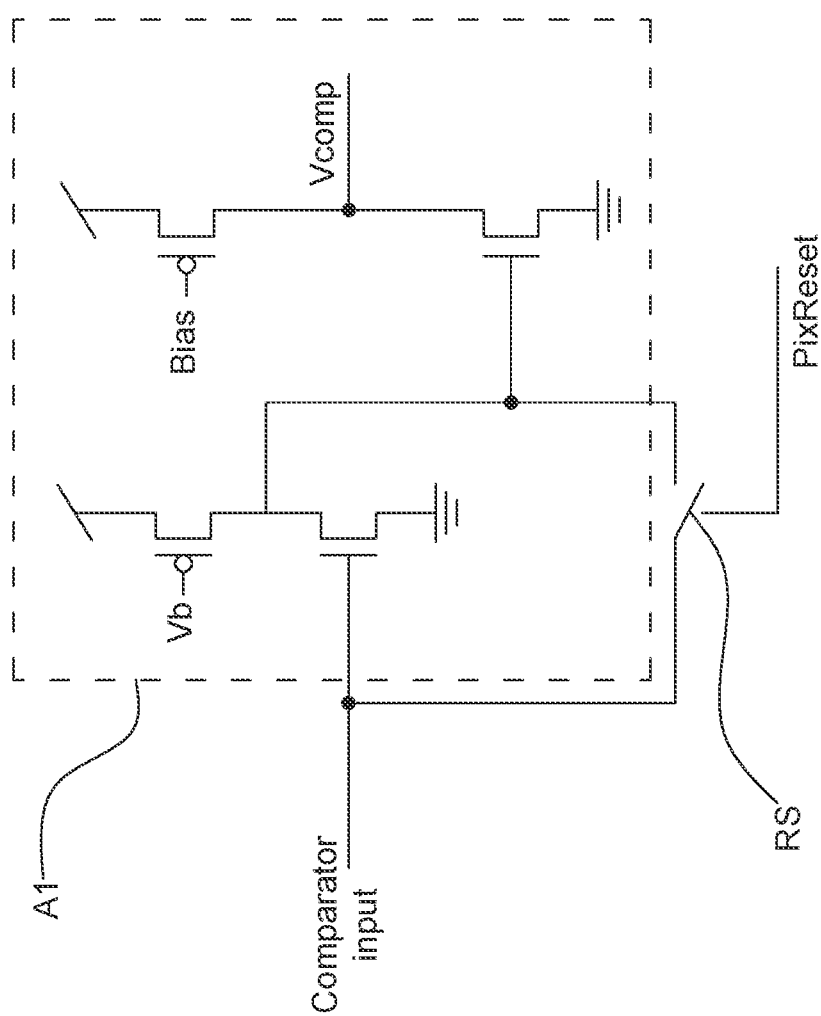
FIG. 16 is a circuit diagram showing an embodiment of a 2-stage comparator A1.
Figure 17:
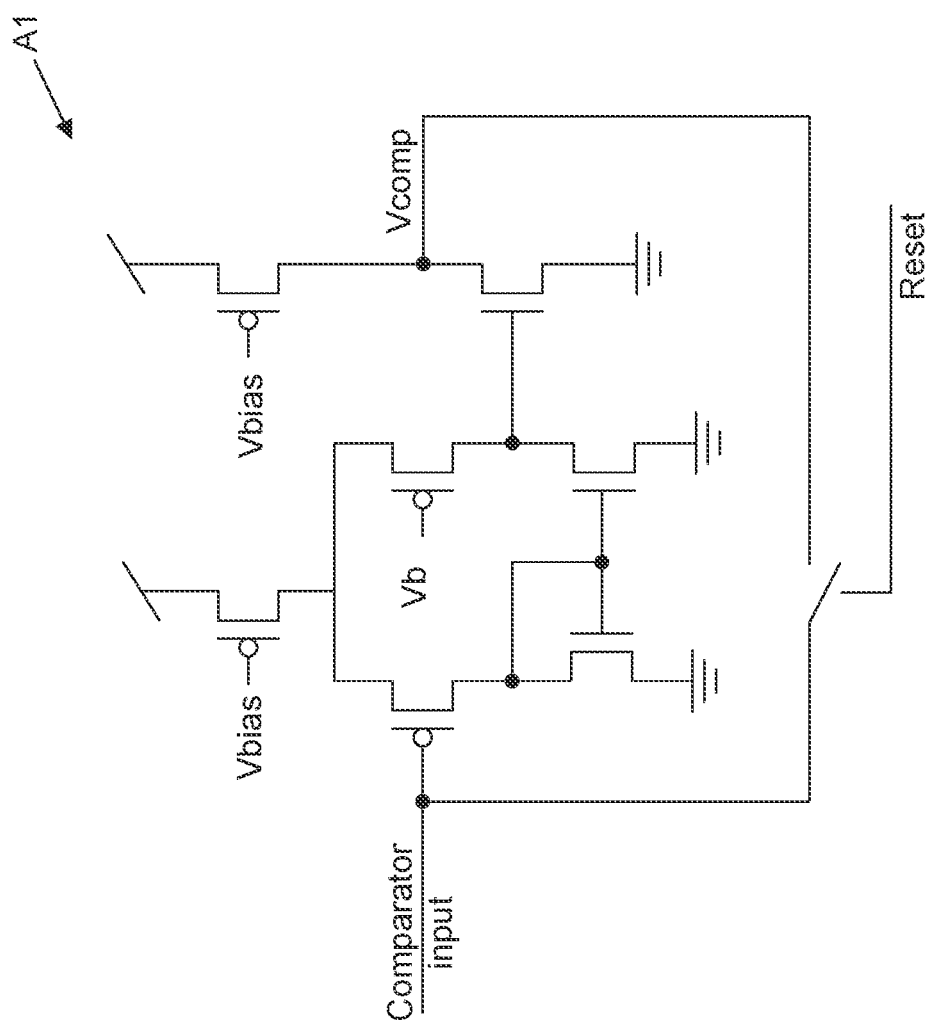
FIG. 17 is a circuit diagram showing an alternative comparator embodiment based on operational transconductance amplifier.

FIGS. 16 and 17 illustrate various embodiments of comparators A1 that are used to detect small changes in the illumination. It is necessary to detect small changes in voltage in the order of a few millivolts. This means the comparator, shown in circuits of FIGS. 1-3, 5, 7, 8, 10, 12-14 will need considerable gain (preferably more than 10 dB or 20 dB and ideally about 40 dB, or more).

FIG. 16 shows a two-stage comparator that will provide the necessary gain. Also shown is the reset switch RS, which in this embodiment does not connect the input and output of the comparator; instead it connects the input to the output of the first stage of the comparator.

FIG. 17 shows another implementation of the comparator A1 based on an operational transconductance amplifier. It uses five transistors with a two-transistor output stage as a comparator. It, has the advantage that the speed of the comparator does not depend on the reference voltage and thus there is more freedom in the range of thresholds. Also, the offset compensation is likely better than using the one of the previous examples using a two transistor-two-stage comparator.

Reset switches and reset circuits are part of the pixel circuit in all embodiments. Their embodiments follow.

The reset switch can be implemented as an NMOS transistor, a PMOS transistor or a complete transmission gate including an NMOS and a PMOS transistor. Depending on the type of switch used, the polarity of the reset signal is active high for an NMOS transistor, active low for a PMOS transistor, and both high and low polarities for a transmission gate. If the reset signal is called PixReset, it is considered active high, if it is called nPixReset, it is considered active low.

Figure 18:
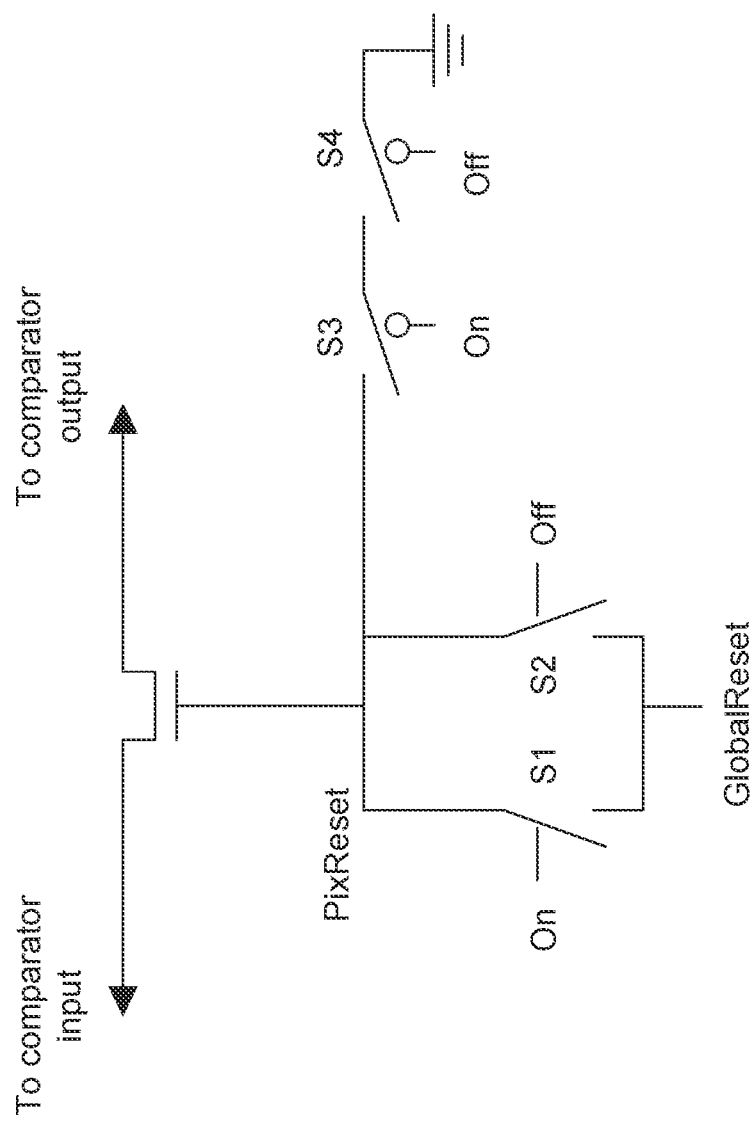
FIG. 18 is a circuit diagram showing an embodiment of a reset circuit.

FIG. 18 shows an implementation of the reset circuit for the pixel circuits in FIGS. 5, 7, and 12. The AND-OR combination for the reset signal generation is used in the circuits shown in FIGS. 5, 7, and 12. The AND-OR, combination circuit shown in FIG. 18 can be implemented for an NMOS transistor that acts as reset switch. ON and OFF are the sampled comparator outputs. If for example ON is a high voltage level, the switch S1 is conducting while S3 is not conducting. The voltage on PixReset will thus in this case follow the voltage of GlobalReset. If the controller sets GlobalReset to a high voltage level, the reset NMOS transistor is conducting and the comparator is reset.

If both ON and OFF are low, neither S1 nor S2 is conducting, but both S3 and S4 are. PixReset is thus tied to ground and thus the reset transistor is not conducting.

Figure 19:
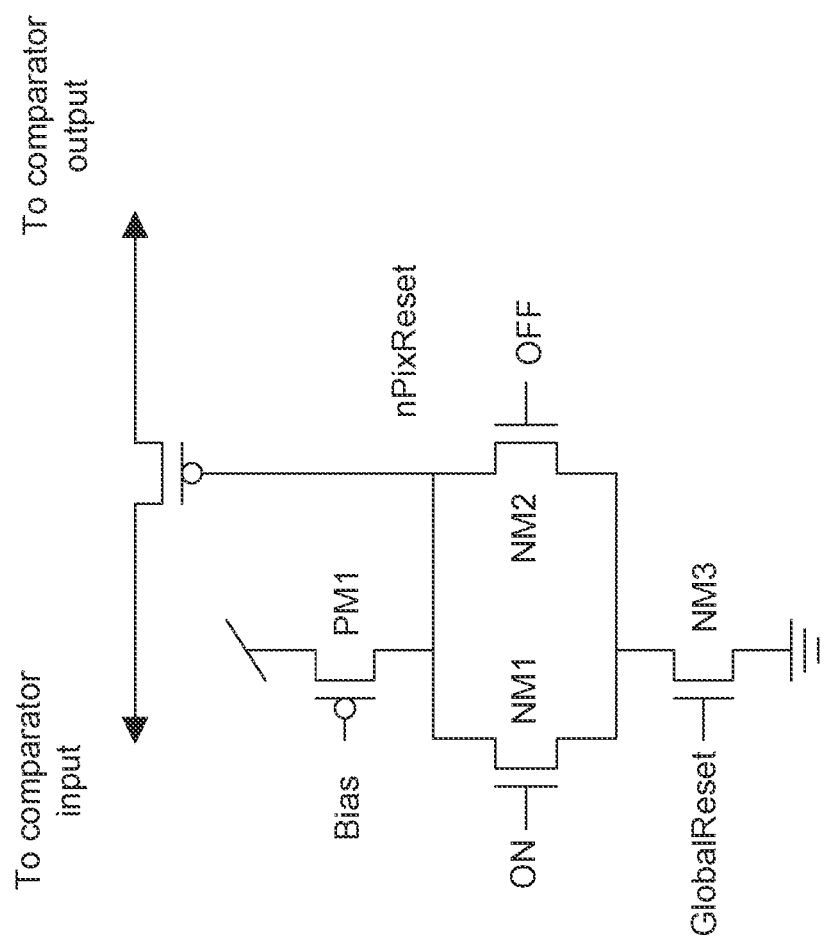
FIG. 19 is a circuit diagram showing an alternative reset circuit.

FIG. 19 shows an alternative implementation of the reset with a PMOS reset transistor. If, for example, the voltage level ON is high, NM1 is conducting. If the controller 60 sets GlobalReset to a high voltage level, NM3 is conducting also and the voltage on nPixReset will be pulled to ground, and thus the PMOS reset transistor is conducting. When the controller 60 sets GlobalReset to a low voltage level, there is no longer a current path between nPixReset and ground. Then the bias current (controlled by the bias voltage on the gate of PM1) in PM1 will slowly pull nPixReset to the power supply. If neither ON or OFF are high voltage levels, the bias current in PM1 will keep nPixReset at the power supply and thus the reset transistor is not conducting.

Figure 20:
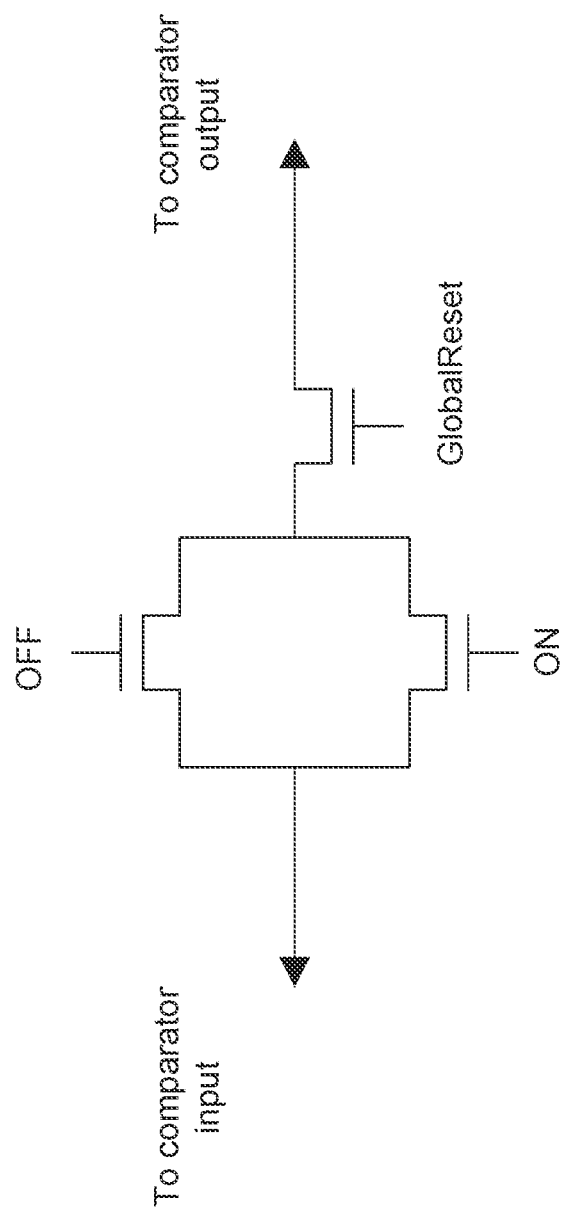
FIG. 20 is a circuit diagram showing a third embodiment of the reset circuit.

FIG. 20 shows still another implementation of the reset circuit. This version integrates the logic function into the actual reset switch. This allows a more compact implementation. The path between the comparator input is conducting if either ON or OFF is a high voltage level and GlobalReset (controlled by the controller 60) is high.

Figure 21:
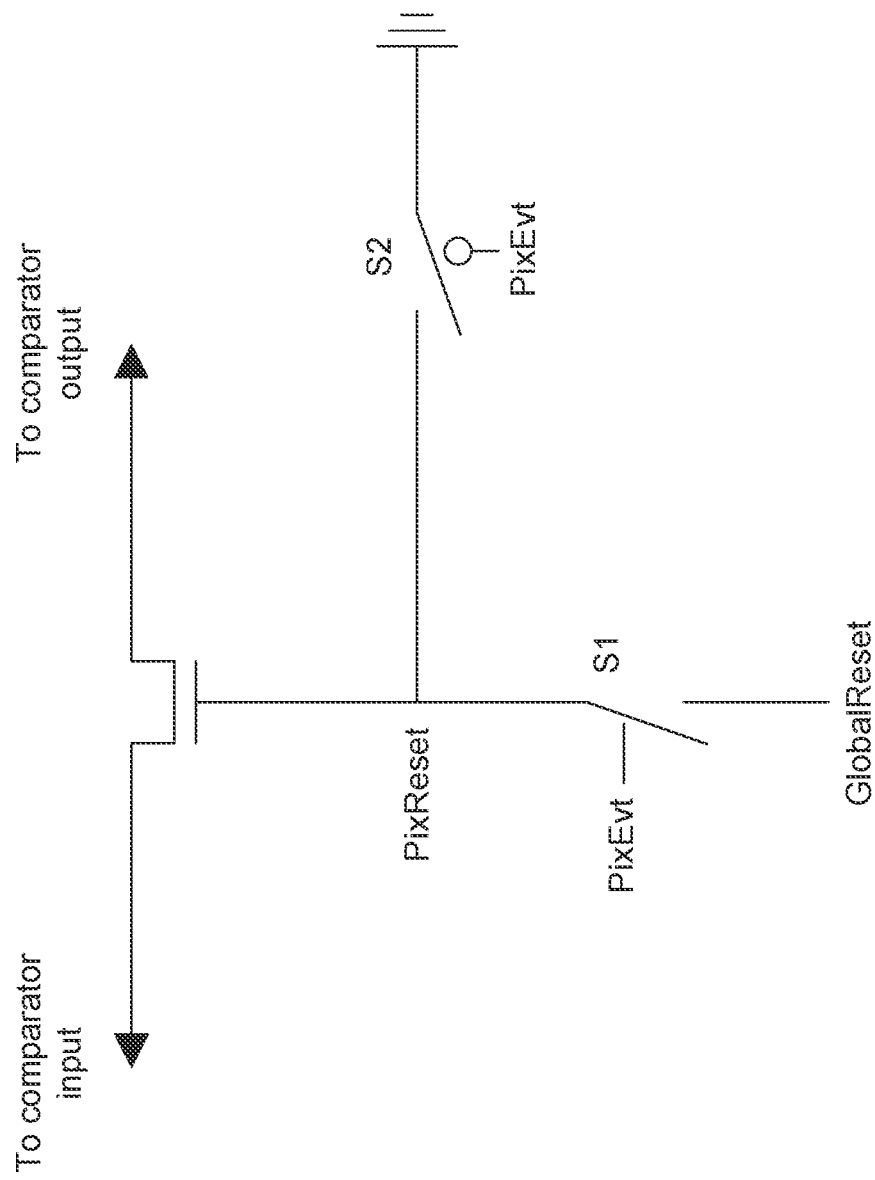
FIG. 21 is a circuit diagram showing the first embodiment of the reset circuit of the pixel embodiment of FIG. 8.

FIG. 21 shows a reset circuit implementation for the pixel embodiment of FIG. 8. Here, an NMOS transistor acts as a reset switch. PixEvt is the sampled comparator output. If PixEvt is a high voltage level, the switch S1 is conducting while S2 is not conducting. The voltage on PixReset will thus in this case follow the voltage of GlobalReset. If the controller sets GlobalReset to a high voltage level, the reset NMOS transistor is conducting and the comparator is reset.

If PixEvt is low, S1 is not conducting, but S2 is. PixReset is thus tied to ground and thus the reset transistor is not conducting.

Figure 22:
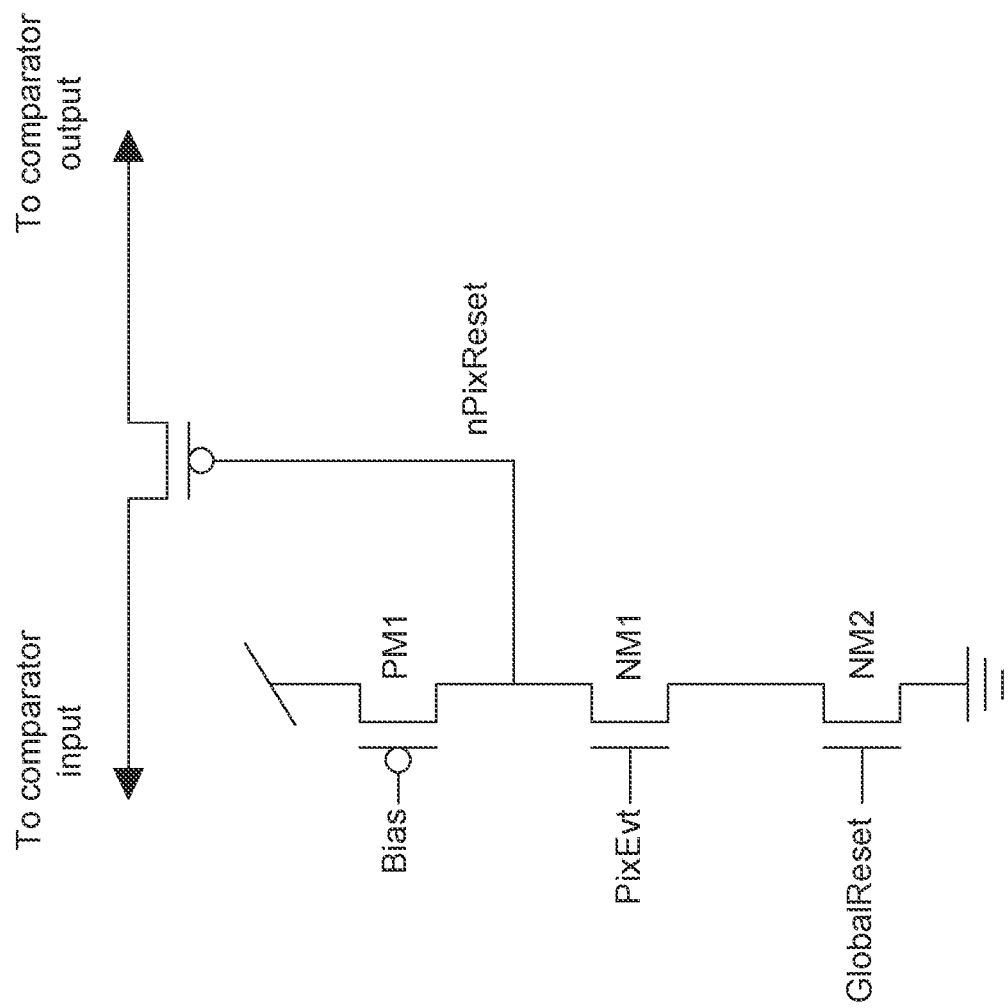
FIG. 22 is a circuit diagram showing an alternative reset circuit of the pixel embodiment of FIG. 8.

FIG. 22 shows a reset circuit implementation. This circuit uses a PMOS reset transistor. If the voltage level PixEvt is high, NM1 is conducting. If the controller sets GlobalReset to a high voltage level, NM2 is conducting also and the voltage on nPixReset will be pulled to ground, and thus the PMOS reset transistor is conducting. When the controller sets GlobalReset to a low voltage level, there is no longer a current path between nPixReset and ground. Then the bias current (controlled by the bias voltage on the gate of PM1) in PM1 will slowly pull nPixReset to the power supply. If PixEvt is a low voltage level, the bias current in PM1 will keep nPixReset at the power supply and thus the reset transistor is not conducting.

Figure 23:
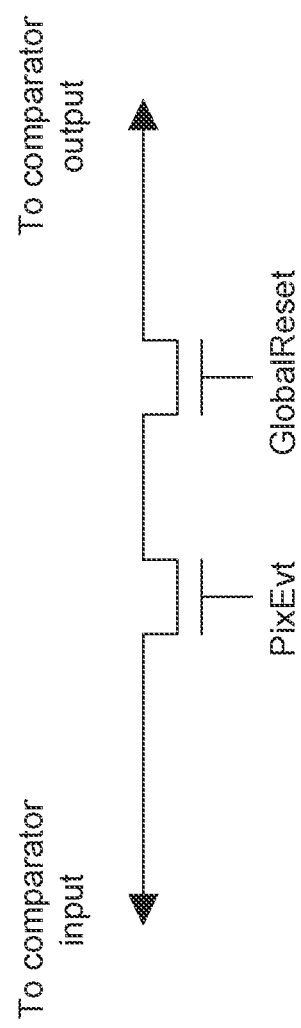
FIG. 23 is a circuit diagram showing the third embodiment of the reset circuit of the pixel embodiment of FIG. 8.

FIG. 23 shows a reset circuit that integrates the logic function into the actual reset switch. This allows a more compact implementation. The path between the comparator input and output is conducting if PixEvt is a high voltage level and GlobalReset (controlled by the controller) is high.

Figure 24:
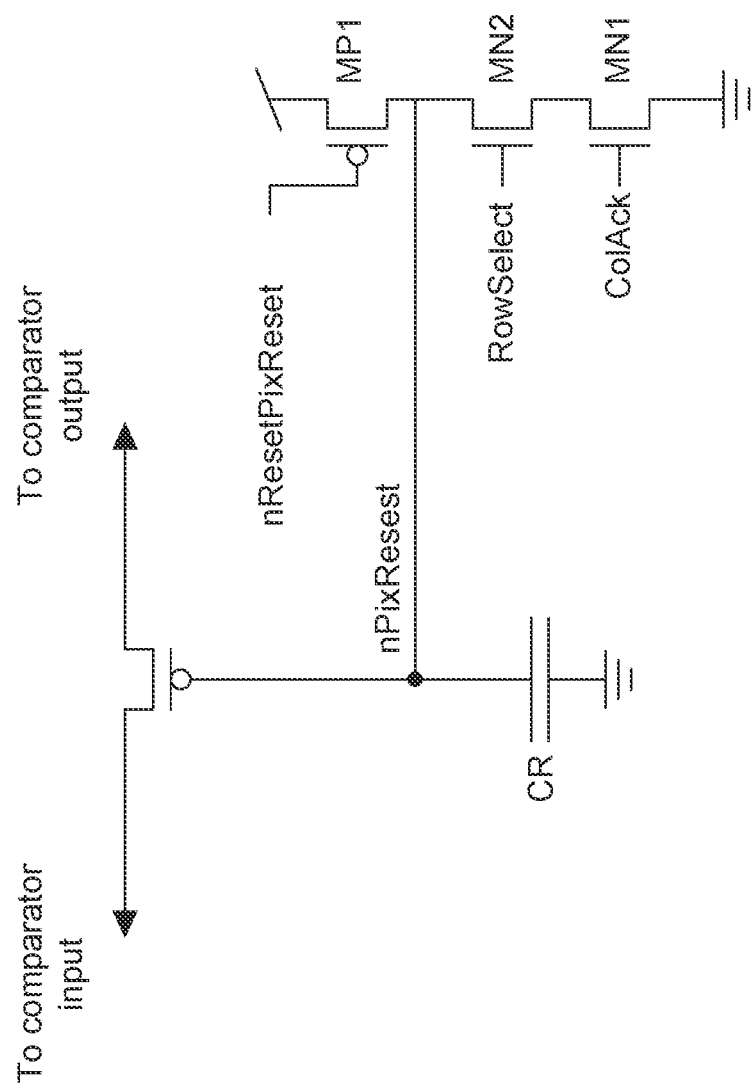
FIG. 24 is a circuit diagram showing the reset circuit for pixel embodiment shown in FIG. 10.

FIG. 24 shows another implementation of the reset circuit implementation that is compatible with the pixel circuit shown in FIG. 10.

Here, when both RowSelect and ColAck (ColAck is the signal from the column logic circuit to the pixel in FIG. 10) are high, the node nPixReset is pulled to ground and this low voltage level is saved on the (explicit or parasitic) capacitor CR, and thus the switch that connects input and output of the comparator is conducting. After readout has been completed in the whole array, all pixels that have generated an event will have nPixReset at ground and are thus reset. Then the controller will set the signal ResetPixReset to a low voltage level and MP1 is conducting, pulling nPixReset to the power supply. By controlling the level of ResetPixReset during the reset phase, the rising slope of PixReset can be controlled.

Figure 25:
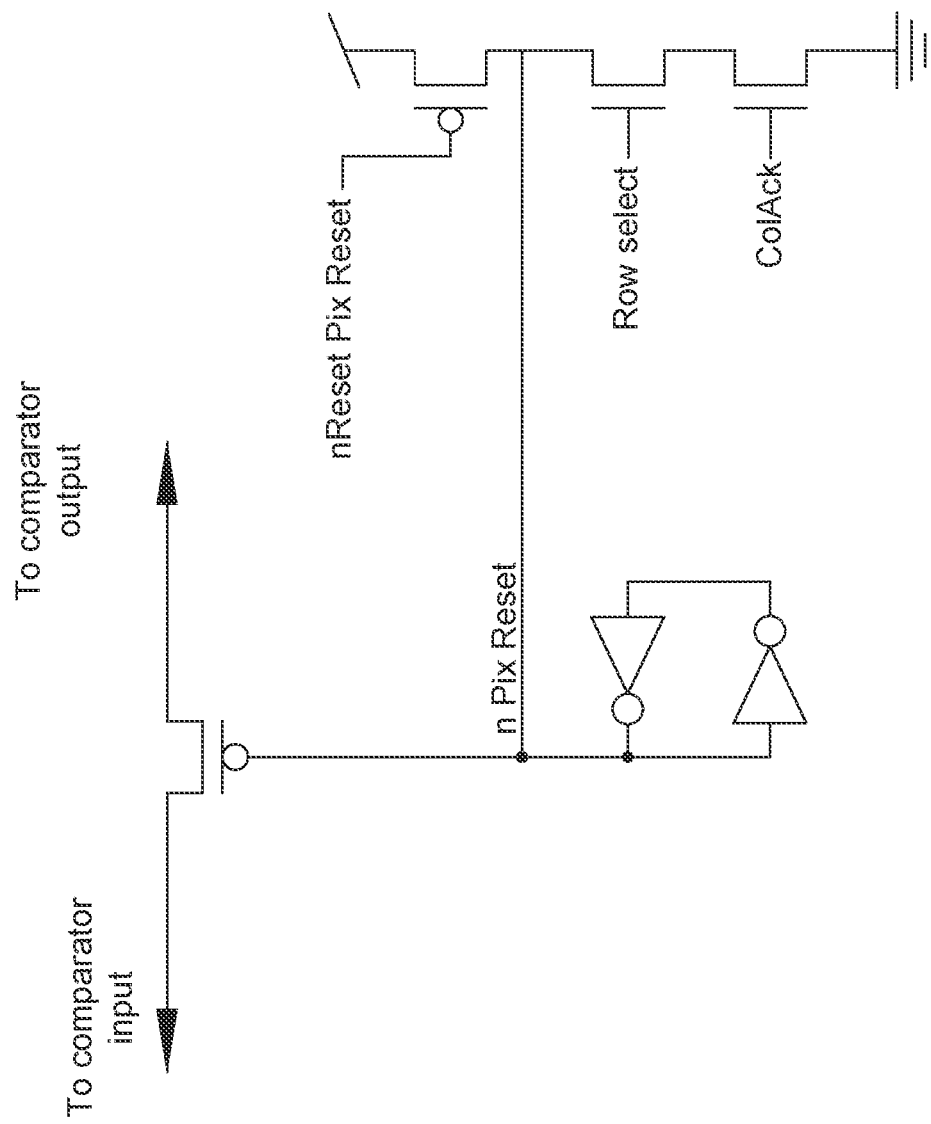
FIG. 25 is a circuit diagram showing the reset circuit embodiment for pixel embodiment shown in FIG. 10.

In the embodiment shown in FIG. 24, the latch for the PixReset signal is implemented using a capacitor (the node is not driven all the time). Alternatively, two cross-coupled inverters can be used as a latch, as shown in FIG. 25.

In the preferred embodiment, the pixel uses a logarithmic front-end to allow for high dynamic range and sensitivity to temporal contrast instead of temporal difference. If a negative feedback circuit is employed, a fast response to illumination changes can be achieved.

Figure 26:
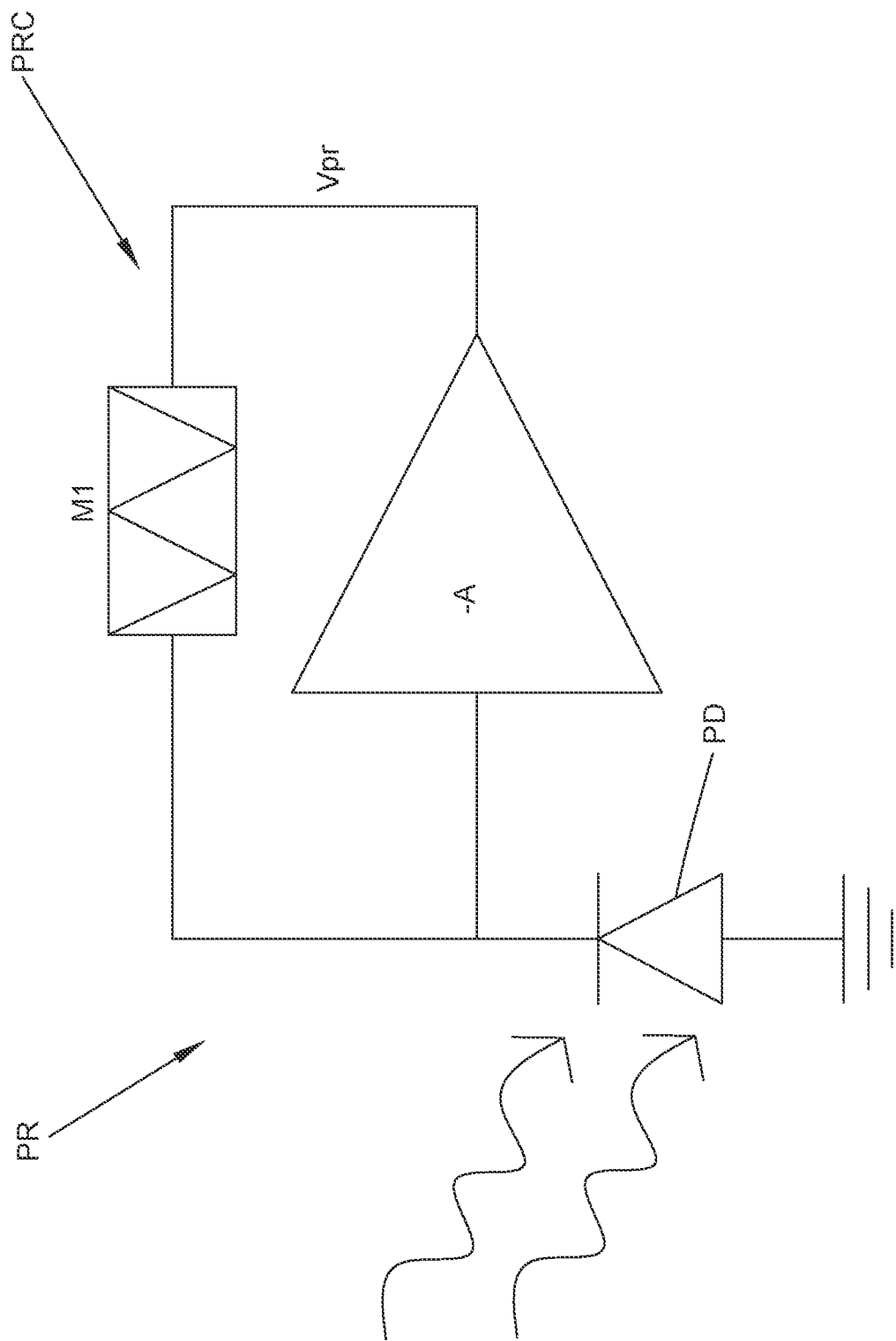
FIG. 26 is a schematic of a photoreceptor circuit.

FIG. 26 shows a basic logarithmic photoreceptor PR with feedback. It uses a photodiode PD as the photosensor. The photoreceptor circuit PRC includes an inverting amplifier and a circuit element M1 with logarithmic current-to-voltage relation that is connected between the input and the output of the inverting amplifier. The inverting amplifier ensures that the voltage over the photodiode PD remains almost constant.

Figure 27:
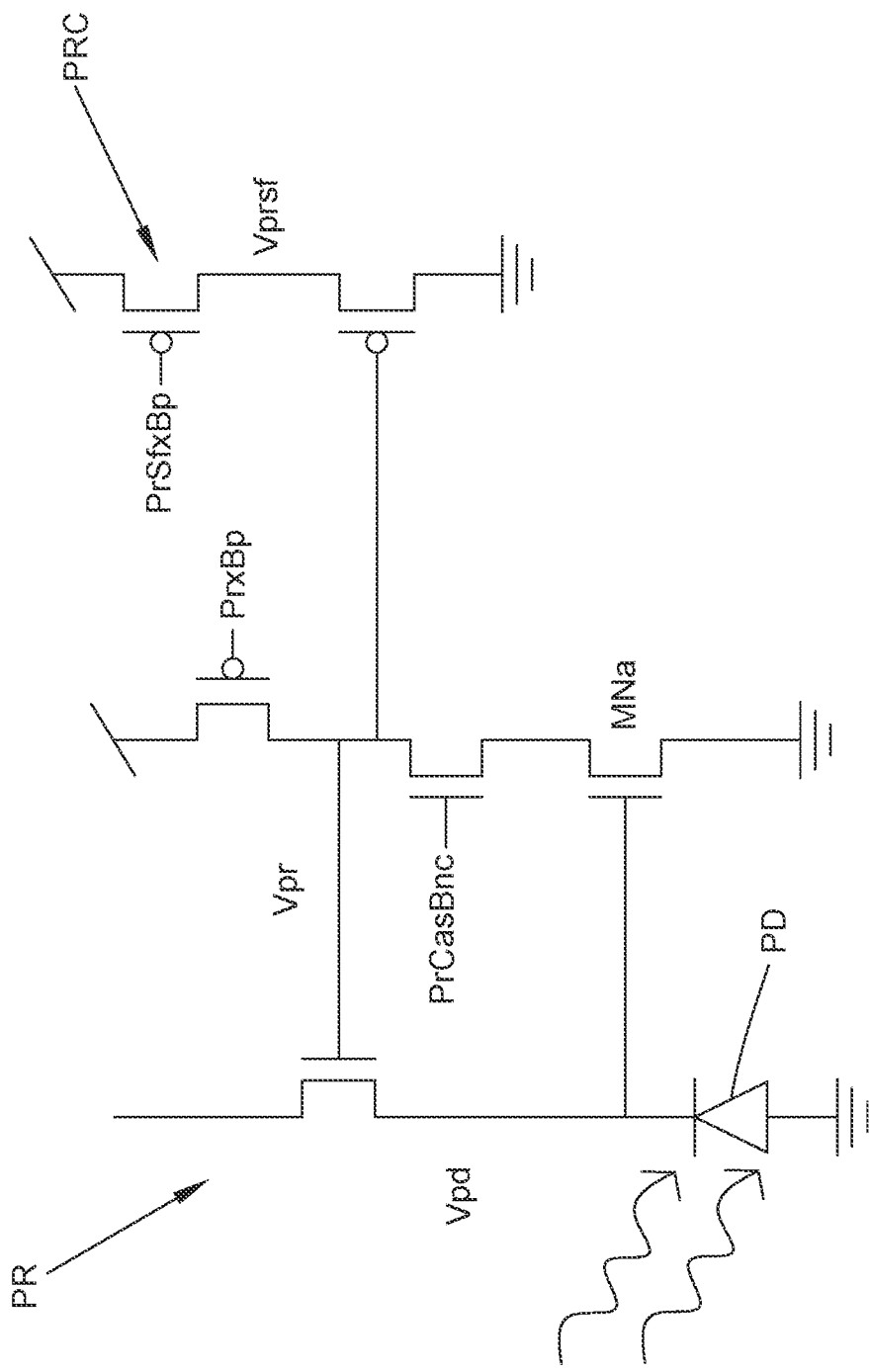
FIG. 27 is a circuit diagram showing the preferred embodiment of a pixel photoreceptor and circuit.

FIG. 27 shows a preferred embodiment of the photoreceptor PR. An NMOS transistor is used as feedback element, and a common source amplifier as inverting amplifier. Between the logarithmic photoreceptor and the capacitor, a source-follower may be used to isolate the front-end from voltage transients during pixel reset. A source follower will also allow adding low-pass filtering of the input signal and thus reduce the integrated noise.

Figure 28:
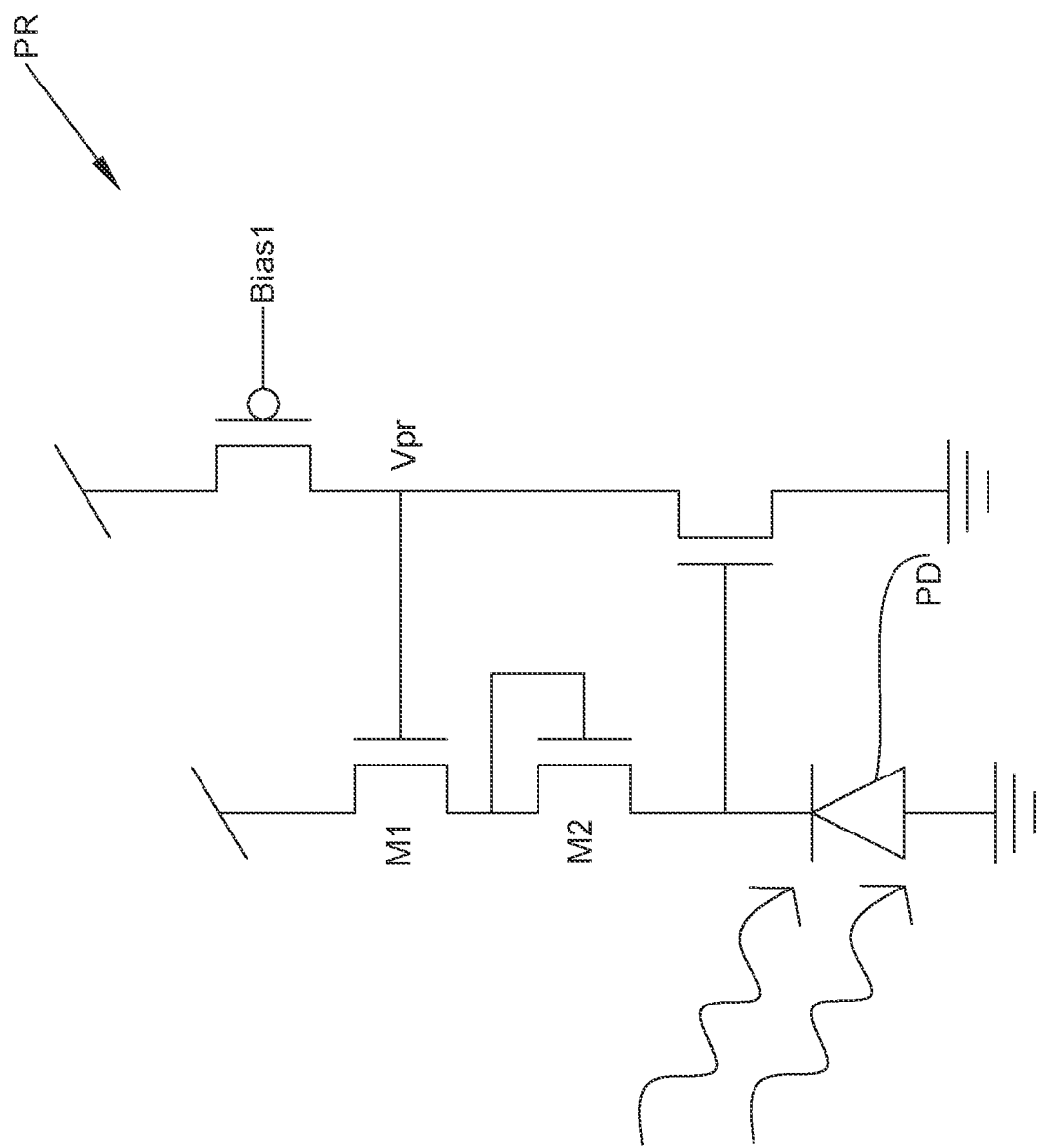
FIG. 28 is a circuit diagram showing an embodiment of a photoreceptor with two NMOS feedback transistors.
Figure 29:
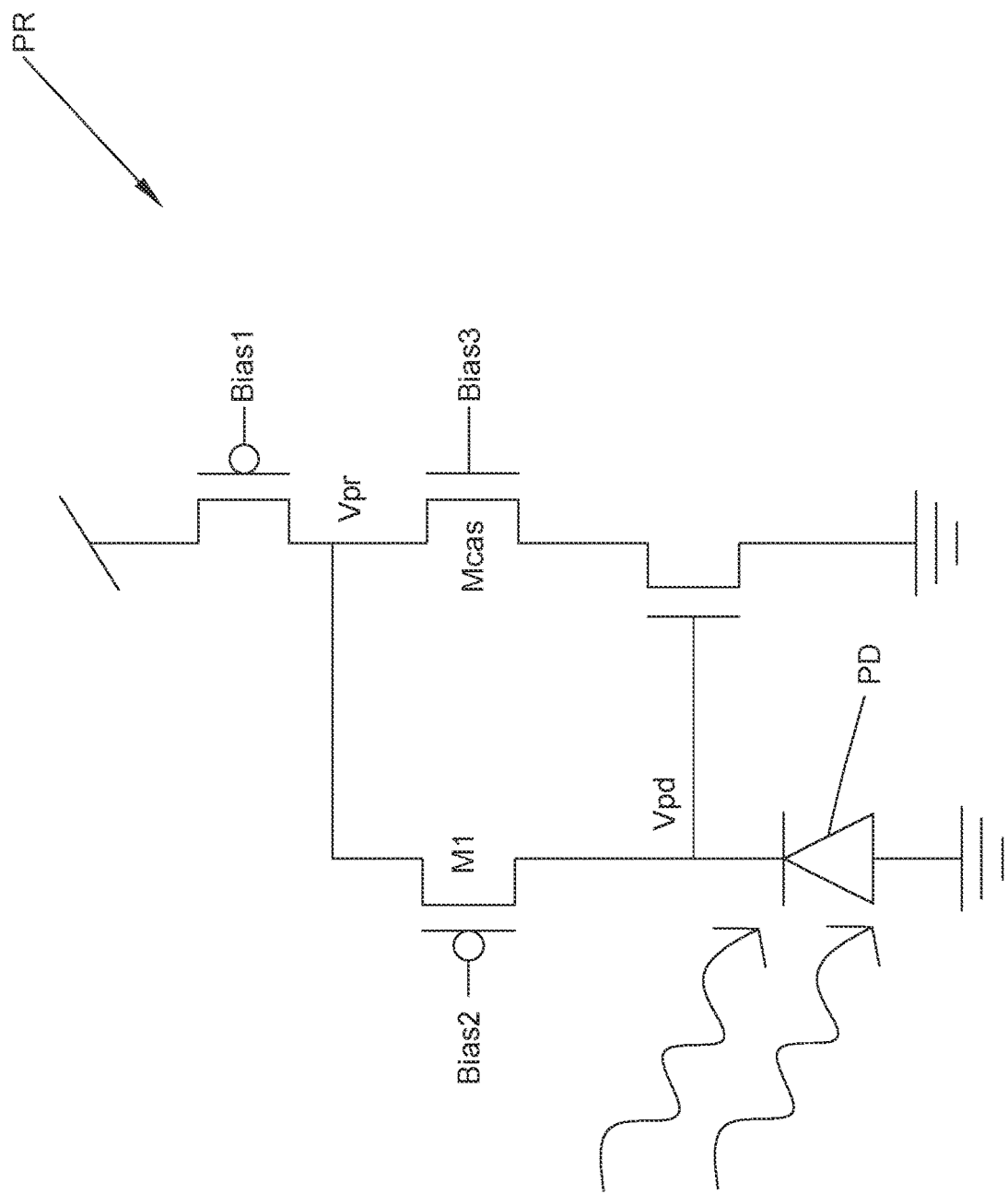
FIG. 29 is a circuit diagram showing an embodiment of a photoreceptor with a PMOS feedback transistor.

FIGS. 28 and 29 show two more options that use two NMOS feedback transistors (FIG. 28) or a PMOS feedback transistor (FIG. 29).

In the pixel readout circuit RO shown in FIG. 5 or 12, the column request lines nRxOn and nRxOff are shared between all pixels in the same column. If the RowSelect is active, and on the parasitic capacitor of NM2 a high voltage is stored, nRxOn is pulled low to signal an ON-event to the data readout circuit. If a low voltage is stored on NM2, NM2 is not conducting and thus nRxOn stays high.

For the pixel circuits shown in FIGS. 8 and 10, the column request line nRx of the readout circuit RO is shared between all pixels in the same column. If the RowSelect is active, and on the parasitic capacitor of NM1 a high voltage is stored, nRx is pulled low to signal an event to the data readout circuit. If a low voltage is stored on NM1, NM1 is not conducting and thus nRx stays high.

The controller 60 generates the necessary waveforms of the control signals to the pixels and controls the voltage Vb at the input of the comparators and generates the necessary waveforms to control the column logic circuits. The controller 60 also synchronizes these waveforms to an external timing reference, in many cases.

The controller 60 can be integrated on the same sensor integrated circuit (IC) as the pixel circuit or in a separate IC using, for example, a microcontroller or a field programmable gate array (FPGA). The controller can be implemented by a finite state machine or using a microcontroller core.

Part of the controller 60 is a row selection circuit. The row selection circuit selects and enables OUT in each pixel in one row by means of a set of RowSelect signals. The row selection circuit has a clock input which allows moving from one row to the next row. The output of the row selection circuit is a set of RowSelect signals, one for each row of pixels. Selecting a row means the RowSelect signal for that row is active (high voltage level), while the RowSelect signals for all other rows are inactive (low voltage level). An active RowSelect signal enables those pixels, where a 'high' comparator output has been sampled, to generate a column request by means of changing the state of a signal line which is shared among all pixels in a column.

The row selection circuit contains a circuit that encodes the address of the currently selected row and outputs this address to the data readout circuit.

The row selection circuit may contain the possibility to be configured in a way to skip rows during scanning. This feature is used to implement a so-called region-of-interest (ROI) readout.

The controller 60 is implemented using software or hardware like a finite state machine which first sets Vb (the first comparator input) to the first threshold voltage (Von), and then, after a short delay sets the signal OnSel to logic high to electrically connect the inverted comparator output to the ON node. Then after another delay, the controller (hardware or software) sets OnSel to logic low to disconnect the inverted comparator output from the ON node. Then it sets Vb to the second threshold voltage (Voff). After a small pause the software sets the signal OffSel to logic high to electrically connect the comparator output to the OFF node. Again after a short delay it sets OffSel to logic low to disconnect the comparator output from the OFF node. Then it sets Vb to the reset voltage Vreset. After a delay, it sets the signal GlobalReset to logic high to electrically connect the second terminal of the capacitor to the reset level. After another delay the software sets the GlobalReset to logic low to disconnect the second terminal of the capacitor from the reset level.

Then the controller sets the first RowSelect line to logic high to connect the memorized comparator outputs of the pixels in the first row to the readout circuit, and sends a signal to the readout circuit to start transmitting the events from this first row. When the readout circuit is finished, the controller sets the first RowSelect line to logic low and sets the second RowSelect line to logic high.

All the rows are processed until exhausted, i.e., the controller has read the memorized comparator outputs for all rows.

When the controller finishes reading all the memorized comparator outputs, it may, after a short delay, restart the sequence by again setting Vb to the first threshold voltage. This process is repeated for the duration of data acquisition by the DVS.

Alternatively, instead of directly restarting the sequence, the controller may wait for an external timing reference signal. This external timing reference signal may come from the processor.

Readout circuits are described below.

It its most basic form, the readout circuit reads the comparator outputs for all pixels 100 in the array 210 and sends a ternary (increase, decrease or no change) image to the receiver once for each frame.

Figure 30:
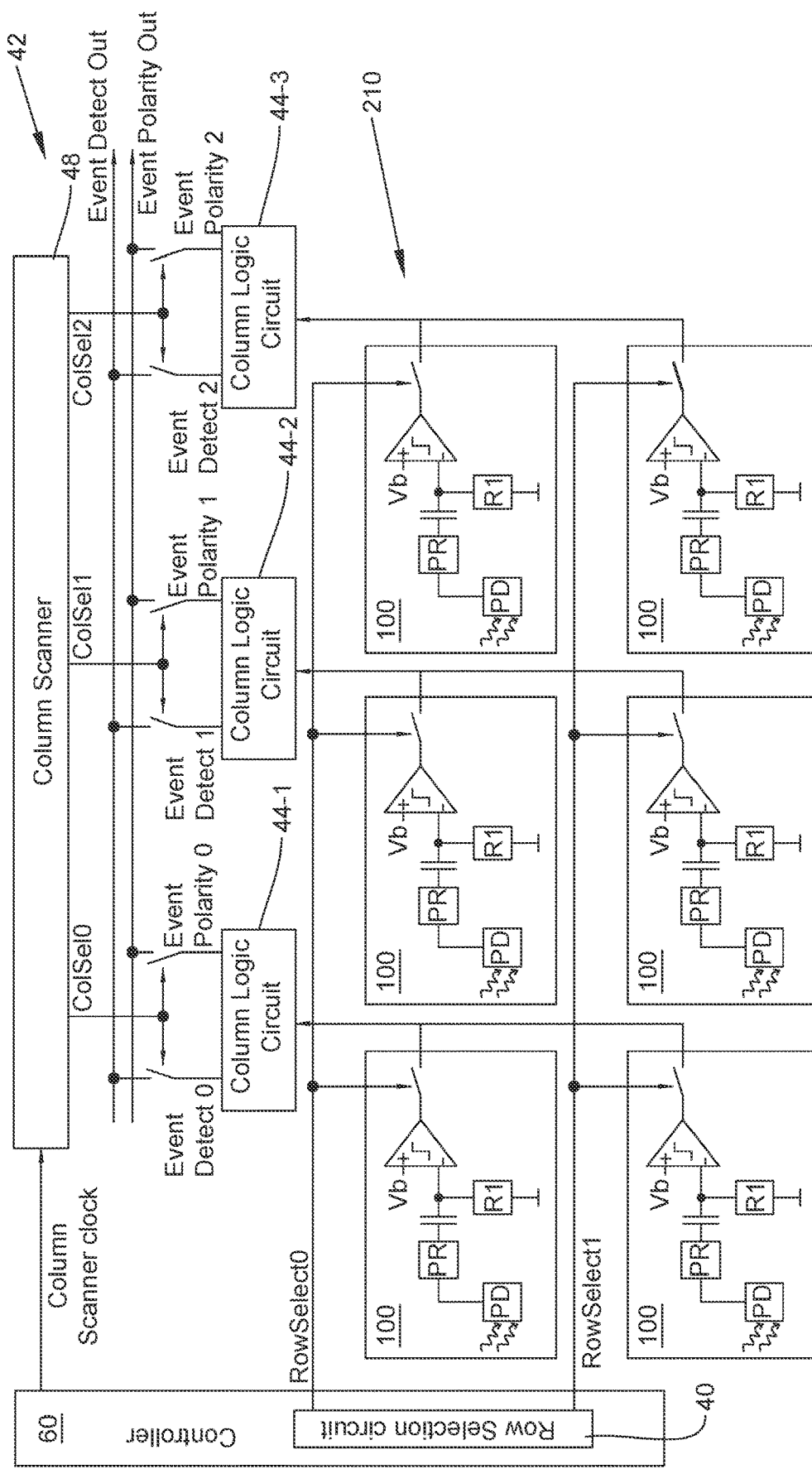
FIG. 30 is schematic diagram showing an embodiment of a basic readout circuit in a pixel array.

FIG. 30 shows a readout circuit for a pixel array 210.

To read the comparator outputs for the whole pixel array 210, the array 210 is scanned row by row. This means the row selection circuit 40 (part of the controller 60) selects one row of pixels, meaning the outputs of the comparators (or the memorized outputs of the comparators, depending on the pixel embodiment) in these pixels are connected to column lines that go to the corresponding column logic circuit 44 of the readout circuit 42. The column logic circuits 44 determine if there has been a change in the corresponding pixels, and then the respective column logic circuit 44 outputs are scanned with a column scanner circuit 48. The column scanner circuit 48 consecutively connects the column logic circuit outputs to the output data lines that go to the processor 46.

Event-based readout is described next.

To allow for a more efficient readout and processing in the processor 46, the data readout circuit can encode the data in a more efficient way. In this kind of pixel circuit, the data is expected to be sparse, which means only a small percentage of pixels per event-frame have registered a change.

Sparse digital signals can easily be further compressed. A popular methodology for compressing multidimensional digital data is to encode the coordinates/addresses of the digital signals in this data. This encoding of digital events is also known as event-based readout. A popular encoding scheme in event-based vision sensors is to encode digital signals as tuples of row and column coordinates of the pixel in the array and a time stamp, leading to encoding the where and when of the incidence of a digital event. This means that, in one embodiment, only the addresses of those pixels where a light intensity change has been detected (an event has happened) are transmitted.

Figure 31:
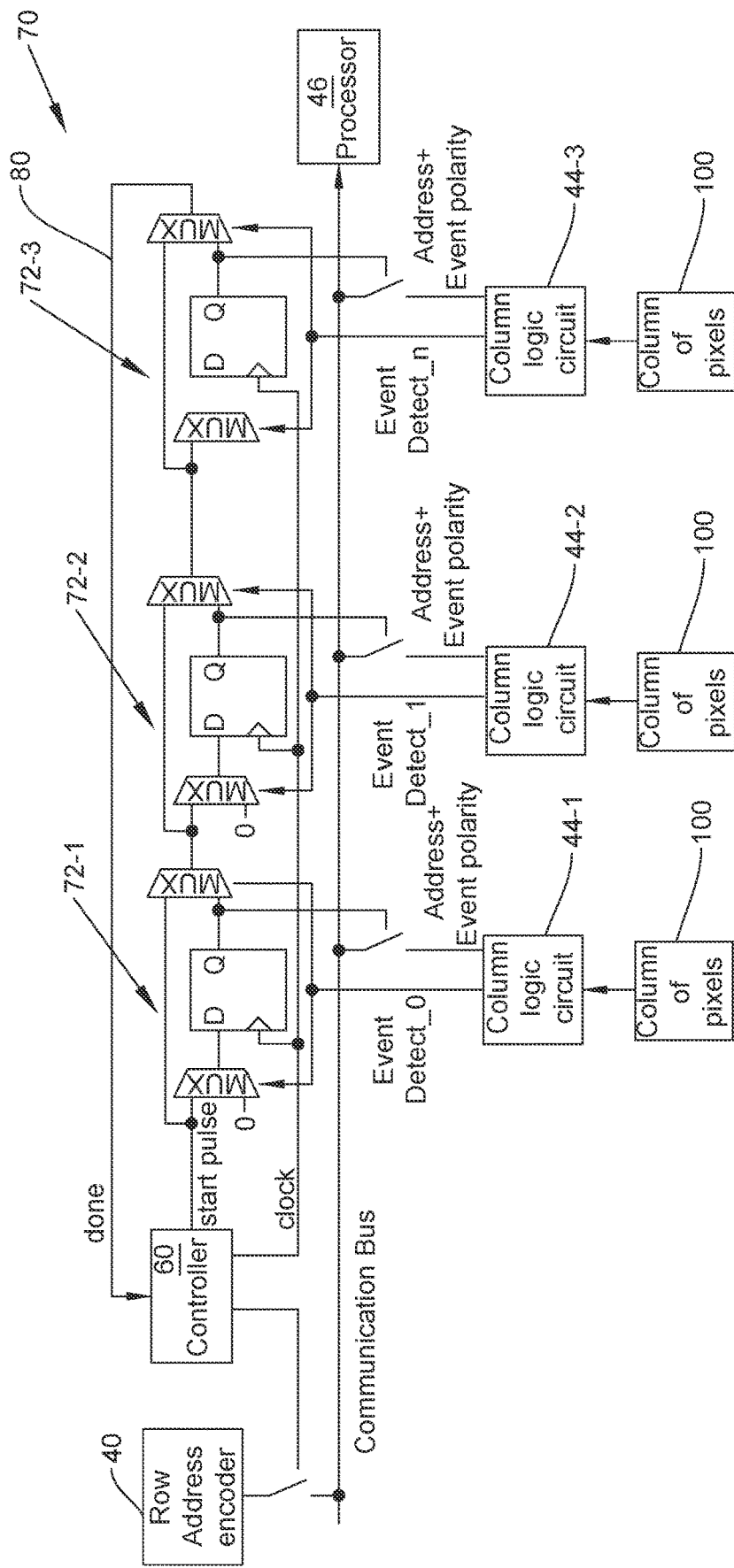
FIG. 31 is schematic diagram showing an embodiment of an event-based readout circuit.

FIG. 31 shows a readout circuit that allows the reading out of the addresses of those pixels where an event has happened. For this, row after row, the address of the corresponding row is output, as well as the addresses of all the columns where an event has been detected by a column logic circuit.

The implementation employs a shift register 70. Each column of pixels has one corresponding shift register stage 72-1, 72-2, 72-3.

Each shift register stage 72-1, 72-2, 72-3 can be bypassed. The bypass is controlled by the EventDetect output of the respective column logic circuit 44-1, 44-2, 44-3. If the EventDetect output is low, the corresponding shift register stage 72-1, 72-2, 72-3 is bypassed. If the EventDetect output is high, the shift register stage 72-1, 72-2, 72-3 is not bypassed.

The controller 60 starts the readout of the events by setting startPulse high and pulsing the clock. This is received at an input multiplexer 74-1 of the first stage 72-1. The input multiplexer provides in the d input to a D-latch 781. The D-latch 78-1 output Q is provided to an output multiplexer 76-1. The clock input is received at the clock input of the D-latch 78-1.

Then the controller sets startPulse low again. The first shift-register stage that is NOT bypassed (e.g., where the corresponding EventDetect is high) will have stored a high voltage level at its output. This connects the Address+EventPolarity of the corresponding column logic circuit to the communication bus. The receiver can now read this address. At the next pulse of clock, the high level moves to the next shift register stage 72, which is not bypassed, and the corresponding Address+EventPolarity is connected to the communication bus. This continues until the high level moves to the last shift register stage 72 that is not bypassed. The output of this stage tells the controller 60 using line 80 that readout is finished for this row. The controller 60 then activates the RowSelect signal for the next row, connects the row address encoder 40 to the communication bus and restarts the shift register.

Column logic circuits are described next.

Figure 32:
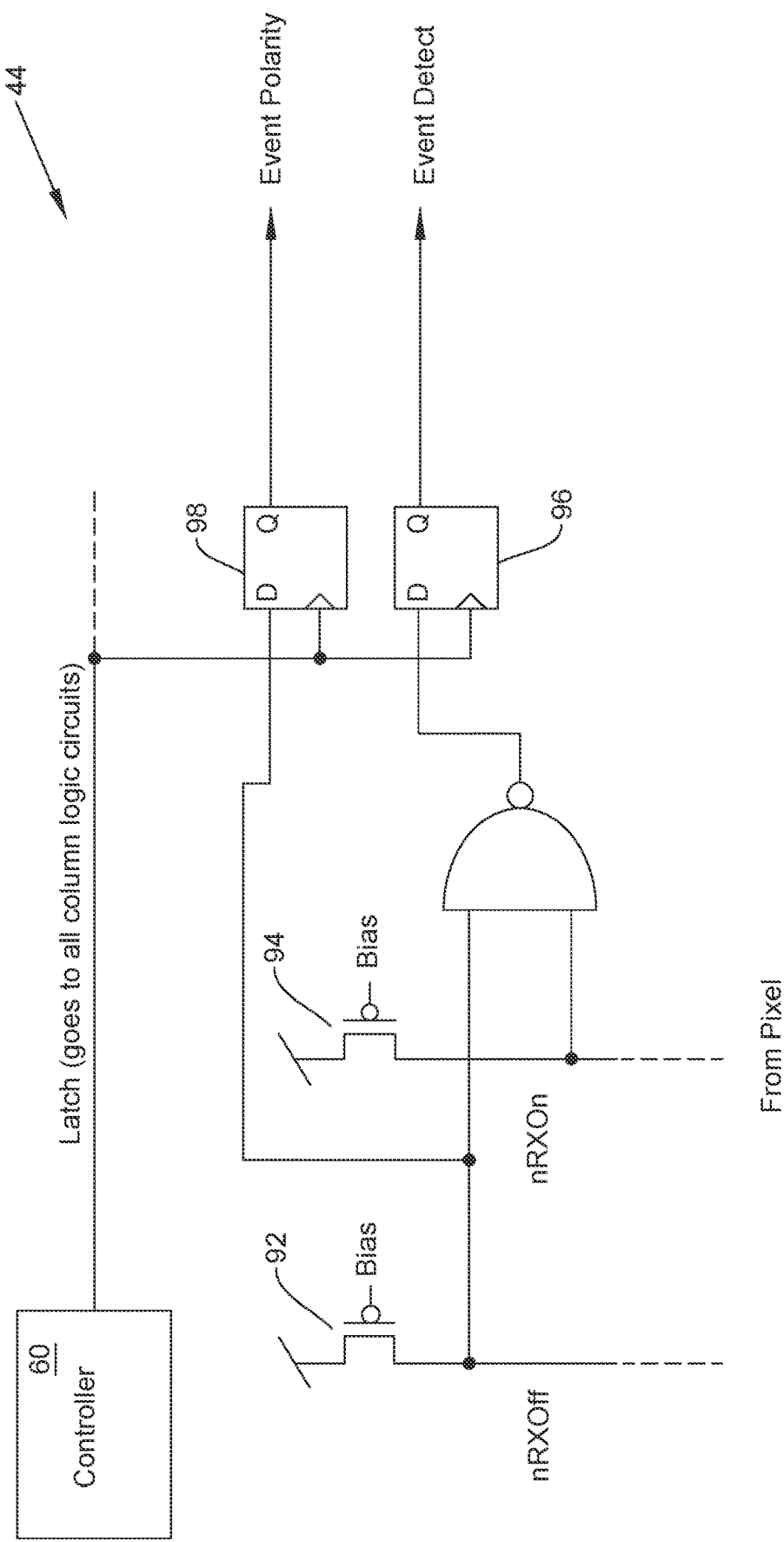
FIG. 32 is a circuit diagram showing the preferred embodiment of a column logic circuit for pixel circuits in FIGS. 5, 7 and 12.

With reference to FIG. 32, for the pixel outputs nRxOn and nRxOff (See FIG. 5 or 7 or 12) or just nRx (See FIG. 10), depending on the pixel circuit embodiment, the column logic circuit 44 determines if the light intensity at the corresponding pixel has not changed, increased or decreased by checking if the state (logic low or logic high) of the pixel output corresponds to a value that represents an increase or decrease. If the column logic circuit 44 detects an increase or decrease, the data readout circuit is notified.

The outputs of the column logic circuit are a signal that is active when an event has been detected (EventDetect), a signal that corresponds to the polarity of the event and a number encoding the column address of the corresponding column. (A high EventPolarity means increase of light intensity). Because the column address is just a fixed number for each column, the implementation is not shown in the figures.

Part of the column logic circuit implementations are bias transistors (92, 94 in FIG. 32) for each request line. Those bias transistors keep the request lines (nRxOn and nRxOff) at logic high level as long as no pixel is pulling on them.

An event occurrence is signaled when one of the two request lines (nRxOff or nRxOn) is at low voltage. The column logic circuit stores the NAND of the two request lines in flip-flop 96 and the state of nRxOff in flip-flop 98 at a time given by the latch clock signal from the controller 60.

Figure 33:
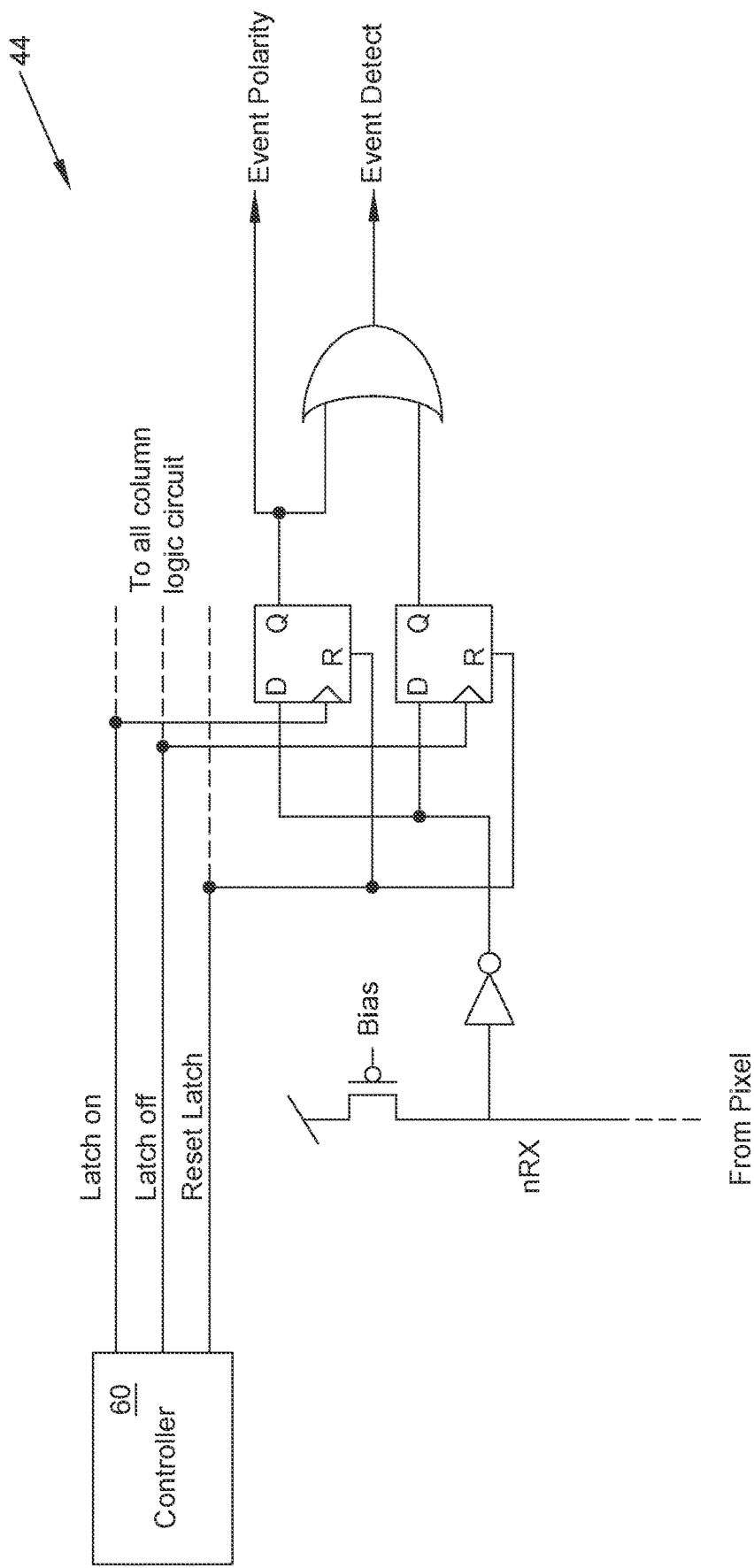
FIG. 33 is a circuit diagram showing an embodiment of a column logic circuit for the pixel circuit of FIG. 8.

Column logic circuit implementation for the pixel circuit of FIG. 8 is shown in FIG. 33.

Here, an event is detected when the request line nRx is low either when Von is applied to the pixel comparator, or when the request line is low when Voff is applied to the pixel comparator. The inverted state of the request line is stored in a Flip-Flop at the command of the controller. EventDetect is the logic OR of the flip-flop outputs.

Figure 34:
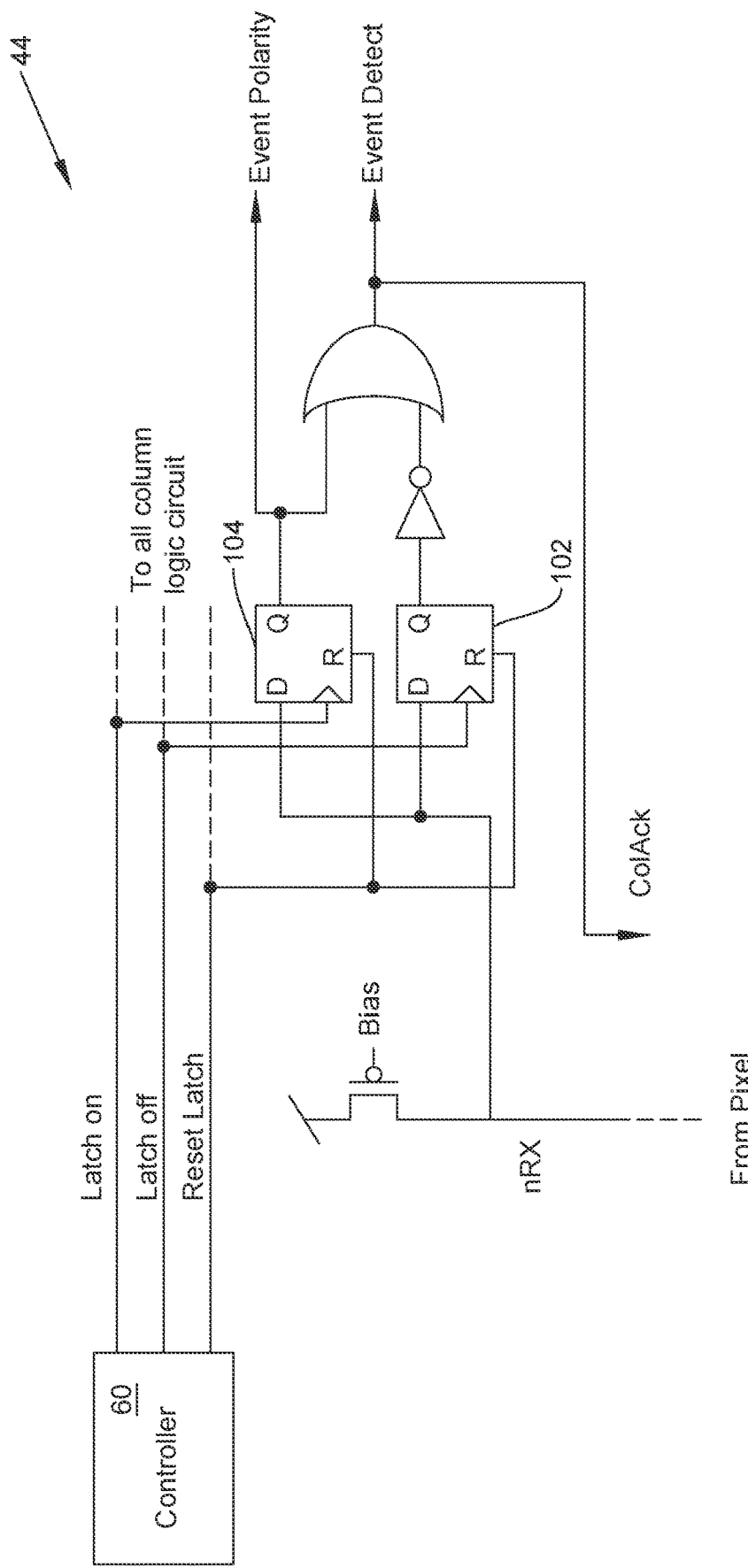
FIG. 34 is a circuit diagram showing an embodiment of a column logic circuit for the pixel circuit of FIG. 10.

Column logic circuit implementation for the pixel circuit of FIG. 10 is shown in FIG. 34.

In addition to the output signal EventDetect and EventPolarity, the column logic circuit for the pixel embodiment of FIG. 10 has to generate a signal that goes to the pixel and in conjunction with the RowSelect signal resets the pixel after detection of an event. In the proposed implementation this ColAck signal is equivalent to the EventDetect signal.

An event is detected when the request line nRx is high when Von is applied to the pixel comparator, or when the request line is low when Voff is applied to the pixel comparator.

Since the pixel circuit embodiment of FIG. 10 does not contain a memory unit in the pixel, the column logic circuit contains a memory unit.

Figure 35:
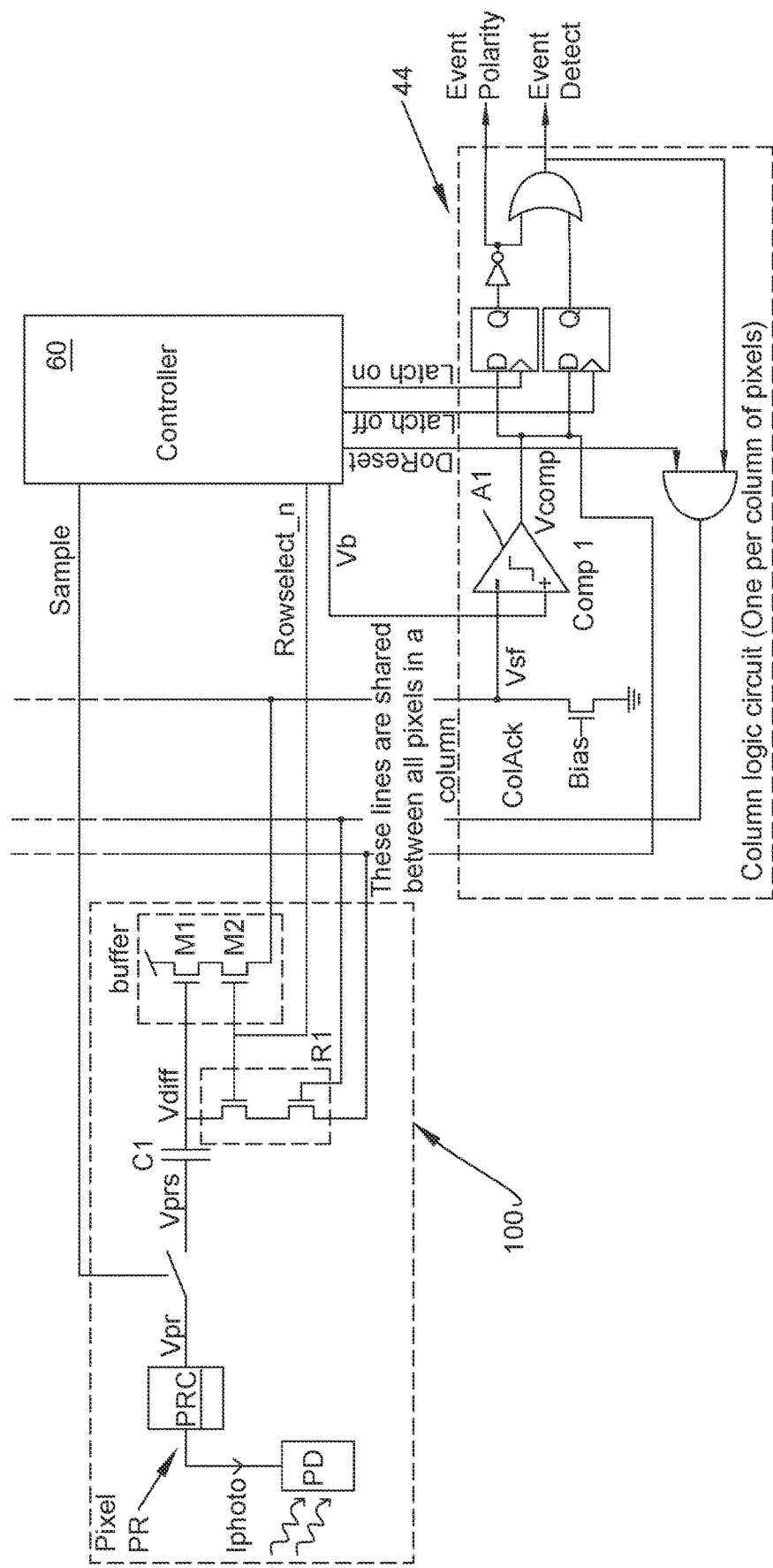
FIG. 35 is a circuit diagram showing an embodiment of a column logic circuit for the pixel circuit of FIG. 13.

Column logic circuit implementation for the pixel of the circuit shown in FIG. 13 is shown in FIG. 35.

Here the column logic circuit includes a comparator A1. The pixel outputs a signal that represents Vdiff, and the comparison to detect events is done in the column logic circuit 44.

Pixel reset is done using the comparator/amplifier Comp1. When a pixel should be reset, the EventDetect signal in the according column is high. The controller 60 will set Vb to Vreset and set DoReset high, making ColAck high. In the row where RowSelect_m is high, the voltage Vdiff is then shorted to Vcomp because both transistors in the according R1 are conducting. The feedback circuit formed by the amplifier Comp1 (A1) and the source-follower will then ensure that Vdiff settles at a voltage that makes Vsf equal to Vreset.

Figure 36:
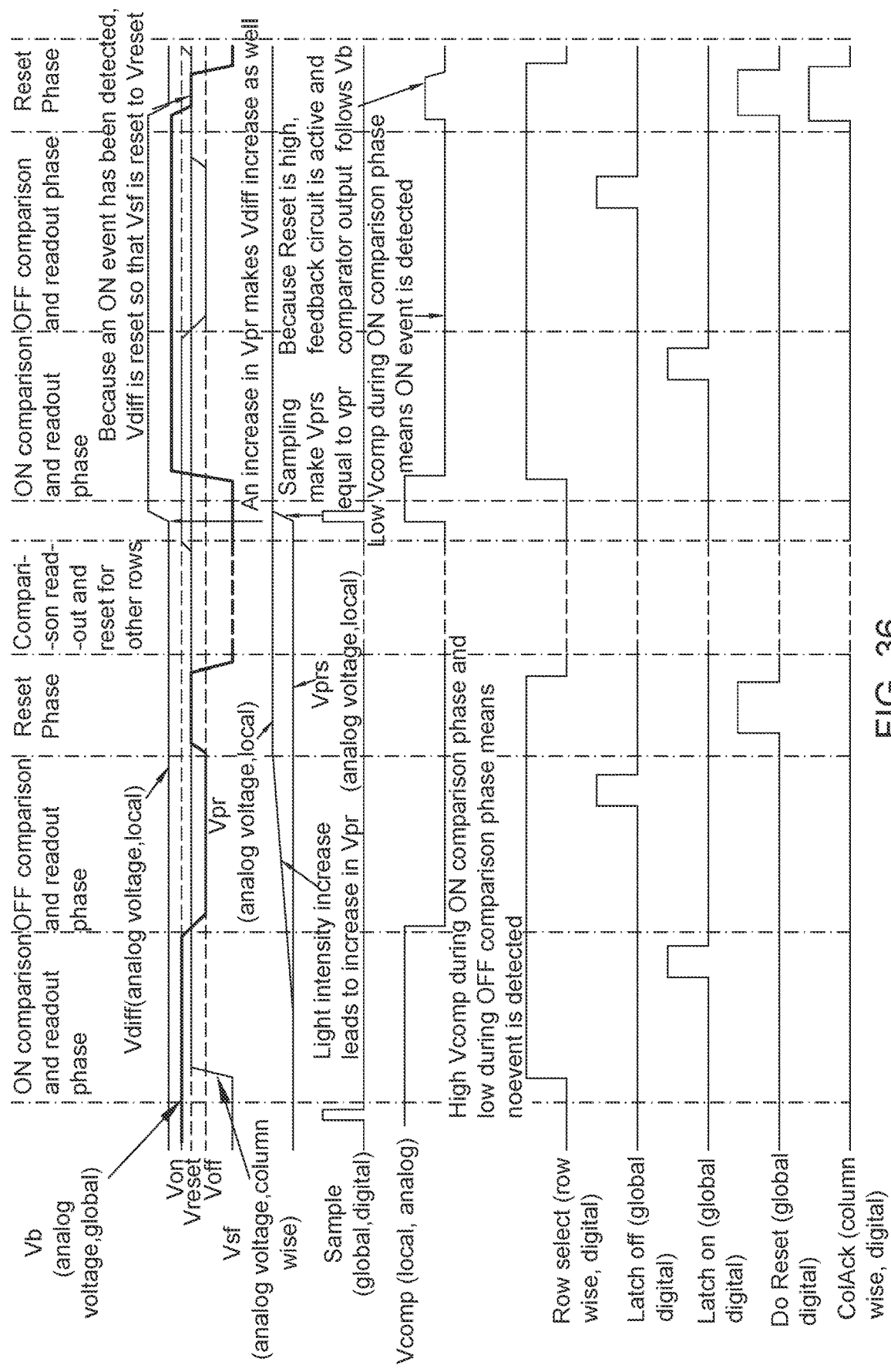
FIG. 36 shows signal time lines for the pixel circuit shown in FIG. 13 and the column logic circuit implementation of FIG. 35.

FIG. 36 shows signal time lines for the pixel circuit shown in FIG. 13 and the column logic circuit implementation of FIG. 35.

Column logic circuit implementation for the pixel circuit of FIG. 14 is shown in FIG. 37.

The column logic circuit contains two comparators A1-1 and A1-2. The two comparators allow comparing Vout to both thresholds at once. At a signal Latches controlled by the controller 60, the comparator outputs are stored in flip-flops 112, 114. The logic OR of the comparator outputs together with a signal DoReset from the controller 60 determine if the pixel is reset or not by means of the signal ColAck.

What is claimed is:

1. An imaging device comprising:
a photoelectric conversion region;
first circuitry coupled to the photoelectric conversion region;
a first capacitor coupled to the first circuitry;
comparison circuitry coupled to the first capacitor that compares a first signal based on an output from the photoelectric conversion region to both a first reference voltage and a second reference voltage selectively and that includes a first terminal that receives the first signal and a second terminal that receives the first reference voltage and the second reference voltage selectively, and reset circuitry that resets the first capacitor based on an output from the comparison circuitry and a global reset signal.

2. The device as claimed in claim 1, wherein the output from the comparison circuitry includes ON event signals and OFF event signals.

3. The device as claimed in claim 1, wherein the comparison circuitry outputs ON event signals during ON comparison phases and OFF event signals during OFF comparison phases.

4. The device as claimed in claim 1, wherein the first reference voltage is coupled to the second terminal during ON comparison phases.

5. The device as claimed in claim 4, wherein the second reference voltage is coupled to the second terminal during OFF comparison phases.

6. The device as claimed in claim 5, wherein the second terminal receives a third reference voltage during reset phases.

7. The device as claimed in claim 6, further comprising controller circuitry that controls the switching of the first reference voltage, the second reference voltage and third reference voltage.

8. The device as claimed in claim 1, wherein the reset circuitry includes a logical AND operator.

9. The device as claimed in claim 1, further comprising memory circuitry that stores the output from the comparison circuitry.

10. The device as claimed in claim 9, further comprising readout circuitry that controls the memory circuitry to read the output from the comparison circuitry.

11. The device as claimed in claim 1, wherein the first circuitry includes logarithm circuit.

12. An imaging device comprising an array of pixels, wherein each of the pixels includes:
a photoelectric conversion region;
first circuitry coupled to the photoelectric conversion region;
a first capacitor coupled to the first circuitry;
comparison circuitry coupled to the first capacitor that compares a first signal based on an output from the photoelectric conversion region to both a first reference voltage and a second reference voltage selectively and that includes a first terminal that receives the first signal and a second terminal that receives the first reference voltage and the second reference voltage selectively, and
reset circuitry that resets the first capacitor based on an output from the comparison circuitry and a global reset signal.

13. The device as claimed in claim 12, wherein the output from the comparison circuitry includes ON event signals and OFF event signals.

14. The device as claimed in claim 12, wherein the comparison circuitry outputs ON event signals during ON comparison phases and OFF event signals during OFF comparison phases.

15. The device as claimed in claim 12, wherein the first reference voltage is coupled to the second terminal during ON comparison phases and the second reference voltage is coupled to the second terminal during OFF comparison phases.

16. The device as claimed in claim 15, wherein the second terminal receives a third reference voltage during reset phases.

17. The device as claimed in claim 16, further comprising controller circuitry that controls the switching of the first reference voltage, the second reference voltage and third reference voltage.

18. The device as claimed in claim 12, wherein the reset circuitry includes a logical AND operator.

19. The device as claimed in claim 12, further comprising memory circuitry that stores the output from the comparison circuitry and readout circuitry that controls the memory circuitry to read the output from the comparison circuitry.

20. The device as claimed in claim 12, wherein the first circuitry includes logarithm circuit.

* * * * *